(12) United States Patent
Kimura

(10) Patent No.: US 7,592,652 B2
(45) Date of Patent: Sep. 22, 2009

(54) ELECTRO-OPTICAL DEVICE

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 335 days.

(21) Appl. No.: 11/327,650

(22) Filed: Jan. 9, 2006

(65) Prior Publication Data

US 2006/0197116 A1 Sep. 7, 2006

Related U.S. Application Data

(60) Division of application No. 10/944,946, filed on Sep. 21, 2004, now Pat. No. 7,012,290, which is a continuation of application No. 10/289,511, filed on Nov. 5, 2002, now Pat. No. 6,958,489, which is a continuation of application No. 09/818,191, filed on Mar. 26, 2001, now Pat. No. 6,475,845.

(30) Foreign Application Priority Data

Mar. 27, 2000 (JP) ............................ 2000-087683

(51) Int. Cl.
*H01L 27/148* (2006.01)
*H01L 29/768* (2006.01)

(52) U.S. Cl. ............... 257/249; 257/236; 257/E29.126; 315/169.2; 315/169.3

(58) Field of Classification Search ................ 257/236, 257/249, 250, E29.126, E29.127, E29.151; 315/169.2, 169.3, 169.4
See application file for complete search history.

(56) References Cited

U.S. PATENT DOCUMENTS

| 4,015,149 A | 3/1977 | Tsunekawa et al. |
| 5,247,190 A | 9/1993 | Friend et al. |
| 5,399,502 A | 3/1995 | Friend et al. |

(Continued)

FOREIGN PATENT DOCUMENTS

EP 0 653 741 5/1995

(Continued)

OTHER PUBLICATIONS

Baldo et al., "Highly Efficient Phosphorescent Emission from Organic Electroluminescent Devices", Nature, pp. 151-154, vol. 395, Sep. 10, 1998.

(Continued)

*Primary Examiner*—Phuc T Dang
(74) *Attorney, Agent, or Firm*—Fish & Richardson P.C.

(57) ABSTRACT

An object of the present invention is to realize a numerical aperture higher than that of a pixel having a conventional construction by using a pixel circuit having a novel construction in an electro-optical device. Therefore, it is utilized that the electric potential of a gate signal line in a row except for an i-th row is set to a constant electric potential in a period except for when a gate signal line (106) in the i-th row is selected. A gate signal line 111 in an (i–1)-th row is also used as an electric current supply line for an EL element (103) controlled by the gate signal line (106) in the i-th row. Thus, wiring number is reduced and high numerical aperture is realized.

20 Claims, 23 Drawing Sheets

U.S. PATENT DOCUMENTS

| | | | |
|---|---|---|---|
| 5,550,066 | A | 8/1996 | Tang et al. |
| 5,585,949 | A | 12/1996 | Yamazaki et al. |
| 5,587,329 | A | 12/1996 | Hseuh et al. |
| 5,652,731 | A | 7/1997 | Saeki |
| 5,670,792 | A | 9/1997 | Utsugi et al. |
| 5,684,365 | A | 11/1997 | Tang et al. |
| 5,736,752 | A | 4/1998 | Hseuh et al. |
| 5,932,892 | A | 8/1999 | Hseuh et al. |
| 6,104,041 | A | 8/2000 | Hsueh et al. |
| 6,236,064 | B1 | 5/2001 | Mase et al. |
| 6,274,887 | B1 | 8/2001 | Yamazaki et al. |
| 6,278,131 | B1 | 8/2001 | Yamazaki et al. |
| 6,424,326 | B2 * | 7/2002 | Yamazaki et al. ............ 345/77 |
| 6,545,359 | B1 * | 4/2003 | Ohtani et al. ............... 257/758 |
| 6,548,960 | B2 * | 4/2003 | Inukai ..................... 315/169.3 |
| 6,576,924 | B1 | 6/2003 | Yamazaki et al. |
| 6,587,086 | B1 * | 7/2003 | Koyama .................... 345/77 |
| 6,774,574 | B1 | 8/2004 | Koyama |
| 6,784,037 | B2 | 8/2004 | Yamazaki et al. |
| 6,835,954 | B2 | 12/2004 | Park et al. |
| 6,921,918 | B2 | 7/2005 | Park et al. |
| 6,977,394 | B2 | 12/2005 | Yamazaki et al. |
| 7,052,930 | B2 | 5/2006 | Park et al. |
| 7,094,624 | B2 | 8/2006 | Park et al. |
| 7,417,253 | B2 | 8/2008 | Yamazaki et al. |
| 2001/0025959 | A1 | 10/2001 | Yamazaki et al. |
| 2005/0259142 | A1 | 11/2005 | Kwak |

FOREIGN PATENT DOCUMENTS

| | | |
|---|---|---|
| EP | 0 717 439 | 6/1996 |
| EP | 0 717 446 | 6/1996 |
| JP | 07-111341 | 4/1995 |
| JP | 08-234683 | 9/1996 |
| JP | 08-241047 | 9/1996 |
| JP | 10-092576 | 4/1998 |
| JP | 11-511898 | 10/1999 |
| JP | 2004-046154 | 2/2004 |
| JP | 2005-338754 | 12/2005 |
| WO | WO 90/13148 | 11/1990 |
| WO | 96/06456 | 2/1996 |

OTHER PUBLICATIONS

Baldo et al., "Very high-efficiency green organic light-emitting devices based on electrophosphorescence", Applied Physics Letters, pp. 4-6, vol. 75, No. 1, Jul. 5, 1999.

Han et al., "Green OLED with low temperature poly Si TFT", pp. 27-30, EuroDisplay '99 Late-news papers, 1999.

Schenk et al., "Polymers for Light Emitting Diodes", EuroDisplay '99 Proceedings, pp. 33-37, 1999.

Shimoda et al., "Current Status and Future of Light-Emitting Polymer Display Driven by Poly-Si TFT", pp. 372-375, SID 99 Digest, 1999.

Shimoda et al., "High Resolution Light Emitting Polymer Display Driven by Low Temperature Polysilicon Thin Film Transistor with Integrated Driver", pp. 217-220, ASIA Display, 98, 1998.

Tsutsui et al., "Electroluminescence in Organic Thin Films", Photochemical Processes in Organized Molecular Systems, pp. 437-450, 1991.

Tsutsui et al., "High Quantum Efficiency in Organic Light-Emitting Devices with Iridium-Complex as a Triplet Emissive Center", Japanese Journal of Applied Physics, pp. L1502-L1504, vol. 38, Part 2, No. 12B, Dec. 15, 1999.

* cited by examiner

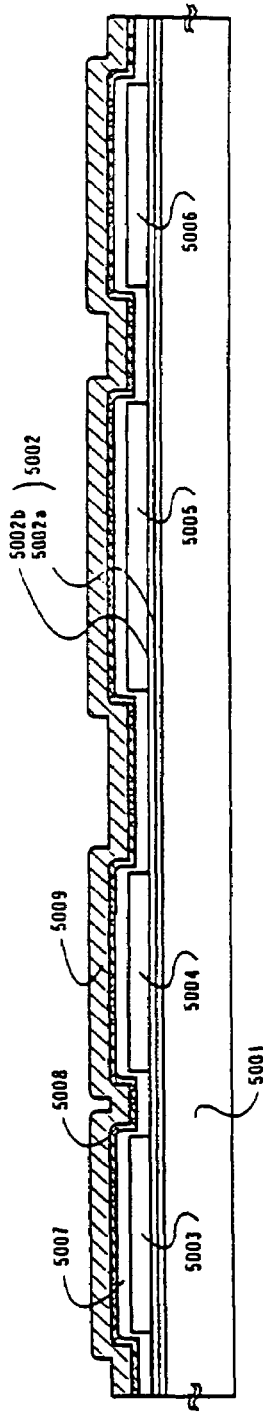
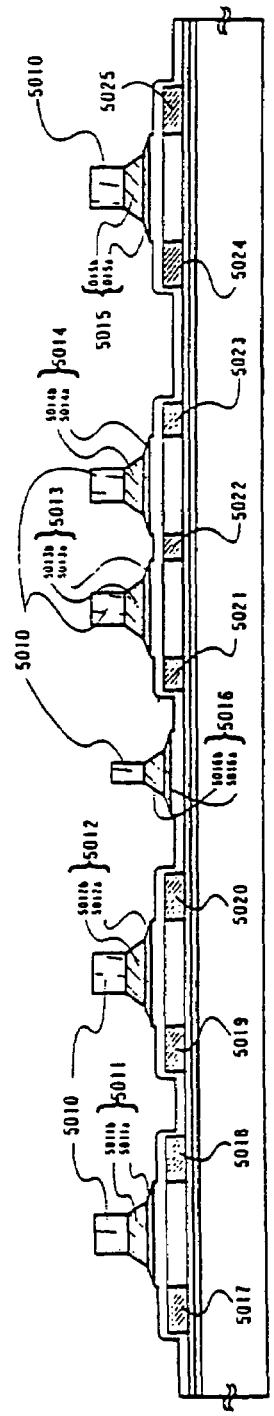
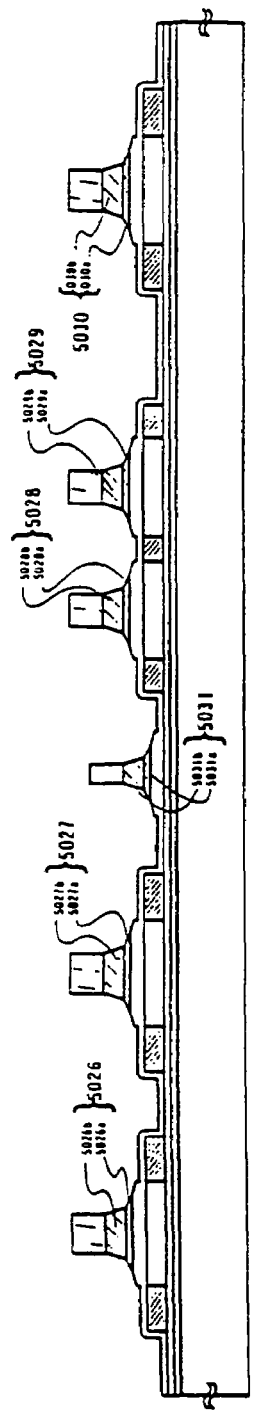
Fig. 8A
Fig. 8B
Fig. 8C 5032-5041 : third impurity region    5200 : resist mask
5042-5051 : second impurity region
5052-5074 : fourth impurity region 5075 : first interlayer insulating film
5076 : second interlayer insulating film
5077-5078 : source wiring
5079 : drain wiring 5080-5082 : connecting wiring
5083 : pixel electrode
5084 : gate signal line
5085 : third interlayer insulating film 5086 : EL layer
5087 : cathode
5088 : protective film
5089 : passivation film

ELECTRO-OPTICAL DEVICE

This application is a DIV of Ser. No. 10/944,946 Sep. 21, 2004 U.S. Pat. No. 7,012,290 which is a CON of Ser. No. 10/289,511 Nov. 5, 2002 U.S. Pat. No. 6,958,489 which is a CON of Ser. No. 09/818,191 Mar. 26, 2001 U.S. Pat. No. 6,475,845.

BACKGROUND OF THE INVENTION

1. Field of the Invention

The present invention relates to the construction of an electro-optical device. The present invention particularly relates to an active matrix type electro-optical device having a thin film transistor (TFT) made on an insulating substrate.

2. Related Background Art

In recent years, an EL display has been attracting attentions as a flat panel display that is to replace an LCD (liquid crystal display), and is actively researched. In the specification, the EL display has an EL element which is also called a light emitting device or a light emitting diode. Further, the EL (Electro Luminescence) includes triplet-based light emission or singlet-based light emission.

There are generally two types of driving system for the LCD display. One type is a passive matrix type used in an STN-LCD, etc. The other type is an active matrix type used in a TFT-LCD, etc. Similarly, there are generally two kinds of driving systems in the EL display. One type is a passive matrix type, and the other type is an active matrix type.

In the case of the passive matrix type, a wiring to serve as an electrode is arranged in each of upper and lower portions of an EL element. A voltage is sequentially applied to the wirings, and an electric current flows through the EL element so that the EL element is lighted.

In contrast to this, in the case of the active matrix type, each pixels has a TFT, and a signal can be held within each pixels.

FIGS. 15A and 15B show a constructional example of the active matrix type electro-optical device used in the EL display. FIG. 15A is a view showing the construction of the entire circuit in which a pixel portion is arranged in the center of this circuit. A gate signal line side driving circuit for controlling the operation of a gate signal line is arranged to the left of the pixel portion. A source signal line side driving circuit for controlling the operation of a source signal line is arranged above the pixel portion. In FIG. 15A, a portion surrounded by a dotted line frame shows a circuit of one pixel. FIG. 15B shows an enlarged view of this circuit. In FIG. 15B, reference numeral 1501 designates a TFT (hereinafter called a switching TFT) functioning as a switching element when a signal is written into a pixel. In FIG. 15B, the switching TFT has a double gate structure, but may also have a single gate structure, a triple gate structure or a multi-gate structure having more than three gates. One of polarities of the TFT may be selected in accordance with a constructional form of the circuit. Reference numeral 1502 designates a TFT (hereinafter called an EL driving TFT) functioning as an element (an electric current control element) for controlling an electric current supplied to an EL element 1503. In FIG. 15B, the TFT 1502 is arranged between an anode 1509 of the EL element 1503 and an electric current supply line 1507. In an alternative constructional method, it is also possible to arrange the TFT 1502 between a cathode 1510 of the EL element 1503 and a cathode electrode 1508. One of polarities of the TFT may be selected in accordance with the constructional form of the circuit. In this case, a system is common and often used in which a p-channel type TFT is used for the EL driving TFT, and the EL driving TFT is arranged between the anode 1509 of the EL element 1503 and the electric current supply line 1507, since source grounding is preferable as the operation of a transistor, and there is a restriction in manufacture of the EL element 1503. Reference numeral 1504 designates a holding capacitor for holding a signal (voltage) inputted from a source signal line 1505. One terminal of the holding capacitor 1504 in FIG. 15B is connected to the electric current supply line 1507, but there is also a case in which dedicated wiring is used. A gate terminal of the switching TFT 1501 is connected to a gate signal line 1506, and a source terminal of this TFT 1501 is connected to the source signal line 1505. A drain terminal of the EL driving TFT 1502 is connected to the anode 1509 of the EL element 1503, and a source terminal of this TFT 1502 is connected to the electric current supply line 1507.

An operation of the circuit of the active matrix type electro-optical device will next be explained with reference to FIGS. 15A and 15B. First, when the gate signal line 1506 is selected, a voltage is applied to a gate of the switching TFT 1501, and the switching TFT 1501 attains a turned-ON state. Thus, a signal (voltage) of the source signal line 1505 is accumulated in the holding capacitor 1504. The voltage of the holding capacitor 1504 becomes a voltage $V_{GS}$ between the gate and the source of the EL driving TFT 1502 so that an electric current according to the voltage of the holding capacitor 1504 flows through the EL driving TFT 1502 and the EL element 1503. As a result, the EL element 1503 is lighted.

Luminance of the EL element 1503, i.e., an electric current amount flowing through the EL element 1503 can be controlled by $V_{GS}$. $V_{GS}$ is the voltage of the holding capacitor 1504, and is a signal (voltage) inputted to the source signal line 1505. Namely, the luminance of the EL element 1503 is controlled by controlling the signal (voltage) inputted to the source signal line 1505. Finally, the gate signal line 1506 is set to a not selected state, and the gate of the switching TFT 1501 is closed, and the switching TFT 1501 is set to a turned-OFF state. At that time, electric charges accumulated in the holding capacitor 1504 are held. Accordingly, $V_{GS}$ is held as it is, and an electric current according to $V_{GS}$ continuously flows through the EL driving TFT 1502 and the EL element 1503.

The descriptions above are reported in SID99 Digest: P372: "Current Status and future of Light-Emitting Polymer Display Driven by Poly-Si TFT", ASIA DISPLAY 98: P217: "High Resolution Light Emitting Polymer Display Driven by Low Temperature Polysilicon Thin Film Transistor with Integrated Driver", Euro Display99 Late News: P27: "3.8 Green OLED with Low Temperature Poly-Si TFT", etc.

In the active matrix type electro-optical device, it is required that the pixel has a large holding capacity and high aperture ratio in view of display performance of this device. Since each pixel has the high aperture ratio, utilization efficiency of light is improved and a display unit can be saved in power and made compact.

In recent years, the pixel is reduced in size and an image with higher definition is required. Since the pixel size is reduced, regions for forming the TFT and wiring come to occupy increased area in one pixel, and the aperture ratio of the pixel is reduced.

Therefore, efficient layout of circuit elements that are required in the circuit construction of the pixel is indispensable to obtain a high aperture ratio of each pixel in the prescribed pixel size.

As mentioned above, a new pixel construction that has not conventionally been found is needed to realize the active matrix type electro-optical device having a high pixel aperture ratio with a reduced mask number.

SUMMARY OF THE INVENTION

The present invention is made to meet such a request, and an object of the present invention is therefore to provide an electro-optical device having a pixel realizing a high aperture ratio by using a pixel having a novel construction without increasing a mask number and a step number.

To solve the above problems of the prior art, the present invention has the following measures.

In the electro-optical device of the present invention, the attention is paid to the fact that, in the construction of a pixel portion of this device that a certain gate signal line has a constant electric potential in a period except for a period where this gate signal line is selected. The electro-optical device of the present invention is characterized in that, when a gate signal line in an i-th row is selected, one of the gate signal lines including the gate signal line in the i-th row substitutes for an electric current supply line for supplying an electric current to pixels in the i-th row. Thus, it is possible to omit the electric current supply line occupying a not-so-small-area of the pixel portion. High aperture ratio can be realized by this method in the pixel portion without increasing a mask sheet number and a manufacturing step number. Further, if the aperture ratio is set to be equal to the conventional aperture ratio, the width of a signal line can be increased so that resistance and noises can be reduced and image quality can be improved.

According to a first aspect of the present invention, there is provided an electro-optical device comprising a source signal line side driving circuit, a gate signal line side driving circuit and a pixel portion, characterized in that:

the source signal line side driving circuit has a plurality of source signal lines;

the gate signal line side driving circuit has n(n is a natural number, 1<n) gate signal lines;

the pixel portion has a structure in which a plurality of pixels are arranged in a matrix-like manner;

the a plurality of pixels controlled by a gate signal line scanned in an i-th column ($1 \leq i \leq n$) among the n gate signal lines each have a switching transistor, an EL driving transistor, and an EL element;

a gate electrode of the switching transistor is electrically connected to the gate signal line scanned in the i-th column;

one of a source region and a drain region of the switching transistor is electrically connected to the source signal line, and the other is electrically connected to a gate electrode of the EL driving transistor; and one of a source region and a drain region of the EL driving transistor is electrically connected to one of the n gate signal lines, and the other is electrically connected to one electrode of the EL element.

According to a second aspect of the present invention, there is provided an electro-optical device comprising a source signal line side driving circuit, a gate signal line side driving circuit and a pixel portion, characterized in that:

the source signal line side driving circuit has a plurality of source signal lines;

the gate signal line side driving circuit has n(n is a natural number, 1<n) gate signal lines;

the pixel portion has a structure in which a plurality of pixels are arranged in a matrix-like manner;

the a plurality of pixels controlled by a gate signal line scanned in an i-th column ($1 \leq i \leq n$) among the n gate signal lines respectively have a switching transistor, an EL driving transistor, and an EL element;

a gate electrode of the switching transistor is electrically connected to the gate signal line scanned in the i-th column;

one of a source region and a drain region of the switching transistor is electrically connected to the source signal line, and the other is electrically connected to a gate electrode of the EL driving transistor;

one of a source region and a drain region of the EL driving transistor is electrically connected to one of the n gate signal lines, and the other is electrically connected to one electrode of the EL element; and an electric current applied to the EL element controlled by the gate signal line scanned in the i-th column is supplied through one gate signal line among the n gate signal lines electrically connected to one of the source region and the drain region of the EL driving transistor.

According to a third aspect of the present invention, there is provided an electro-optical device comprising a source signal line side driving circuit, a gate signal line side driving circuit and a pixel portion, characterized in that:

the source signal line side driving circuit has a plurality of source signal lines;

the gate signal line side driving circuit has n(n is a natural number, 1<n)-gate signal lines;

the pixel portion has a structure in which a plurality of pixels are arranged in a matrix-like manner;

the a plurality of pixels controlled by a gate signal line scanned in an i-th column ($1 \leq i \leq n$) among the n gate signal lines respectively have a switching transistor, an EL driving transistor, and an EL element;

a gate electrode of the switching transistor is electrically connected to the gate signal line scanned in the i-th column;

one of a source region and a drain region of the switching transistor is electrically connected to the source signal line, and the other is electrically connected to a gate electrode of the EL driving transistor;

one of a source region and a drain region of the EL driving transistor is electrically connected to one of the n gate signal lines, and the other is electrically connected to one electrode of the EL element;

the gate signal line scanned in the i-th column has a function for controlling operations of the a plurality of pixels electrically connected to the gate signal line scanned in the i-th column when scanning the i-th column; and when scanning the gate signal line for controlling the operations of the a plurality of pixels including a plurality of EL driving transistors of which one of the source region and the drain region is electrically connected to the gate signal line in the i-th column, the gate signal line has a function as an electric current supply line for the EL element arranged in each of the a plurality of pixels controlled by the gate signal line.

According to a fourth aspect of the present invention, the electro-optical device of any one of the first to third aspects of the invention is characterized in that:

polarity of the EL driving transistor electrically connected to the EL element is p-channel type when a light emitting direction of the EL element is a direction directed to a substrate on which a driving circuit is formed;

the polarity of the EL driving transistor electrically connected to the EL element is n-channel type when the light emitting direction of the EL element is a direction reverse to the direction directed to the substrate on which the driving circuit is formed; and polarity of the switching transistor is the same as the polarity of the EL driving transistor.

According to a fifth aspect of the present invention, the electro-optical device of any one of first to fourth aspects of the invention is characterized in that the gate signal line is formed by using aluminum or a material having aluminum as a principal component.

BRIEF DESCRIPTION OF THE DRAWINGS

In the accompanying drawings:

FIGS. 8A to 8C are diagrams showing a manufacturing process example of an electro-optical device shown in an embodiment 2;

DESCRIPTION OF THE PREFERRED EMBODIMENTS

Figure 1A:
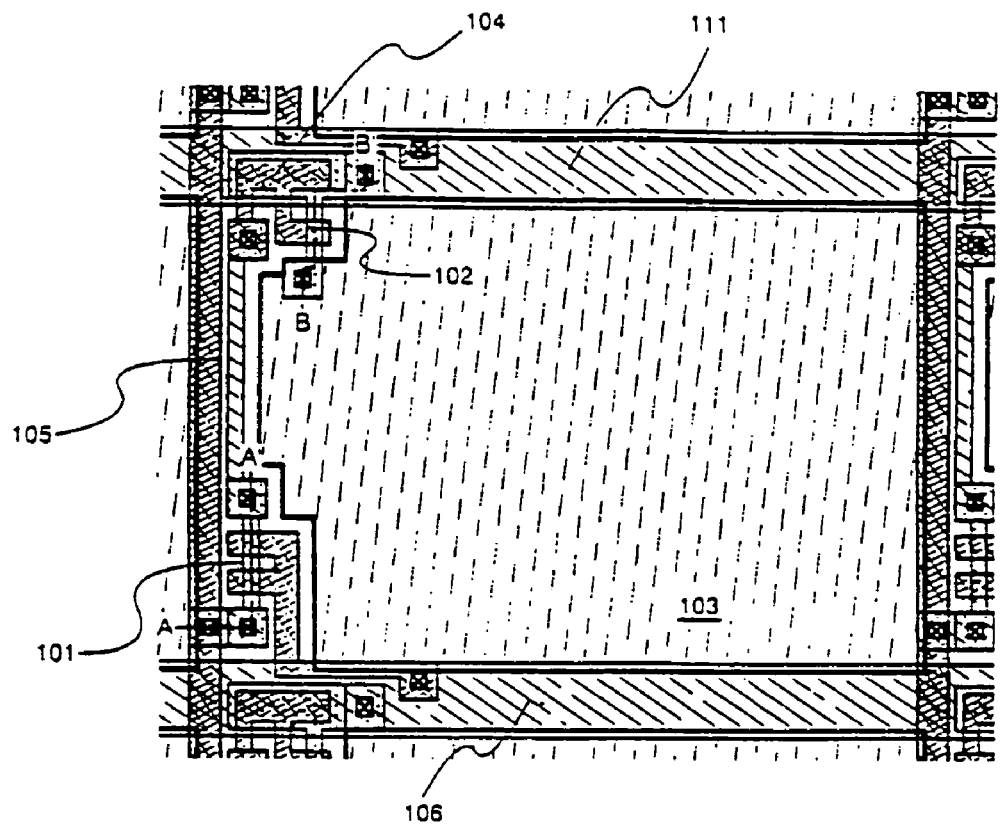
FIGS. 1A and 1B are, respectively, a plan view and a circuit diagram of a pixel having a structure in which an electric current supply line and a gate signal line are common in the present invention.
Figure 1B:
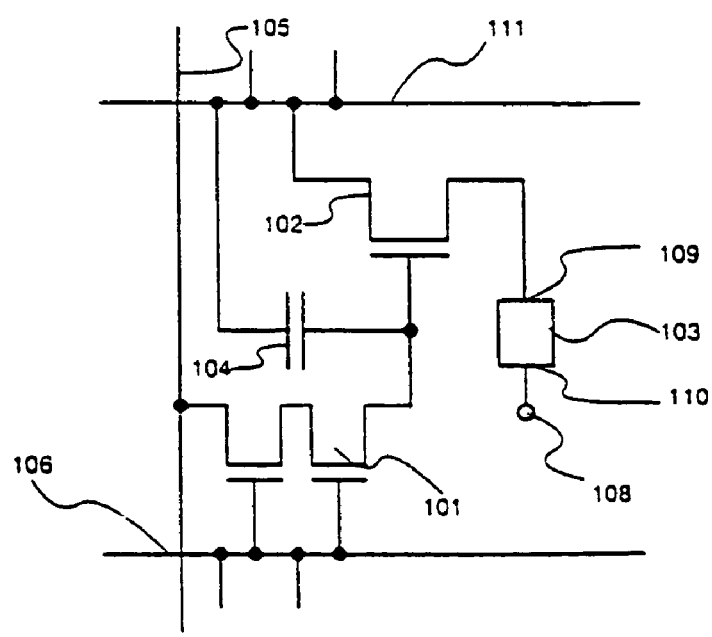
Figure 2A:
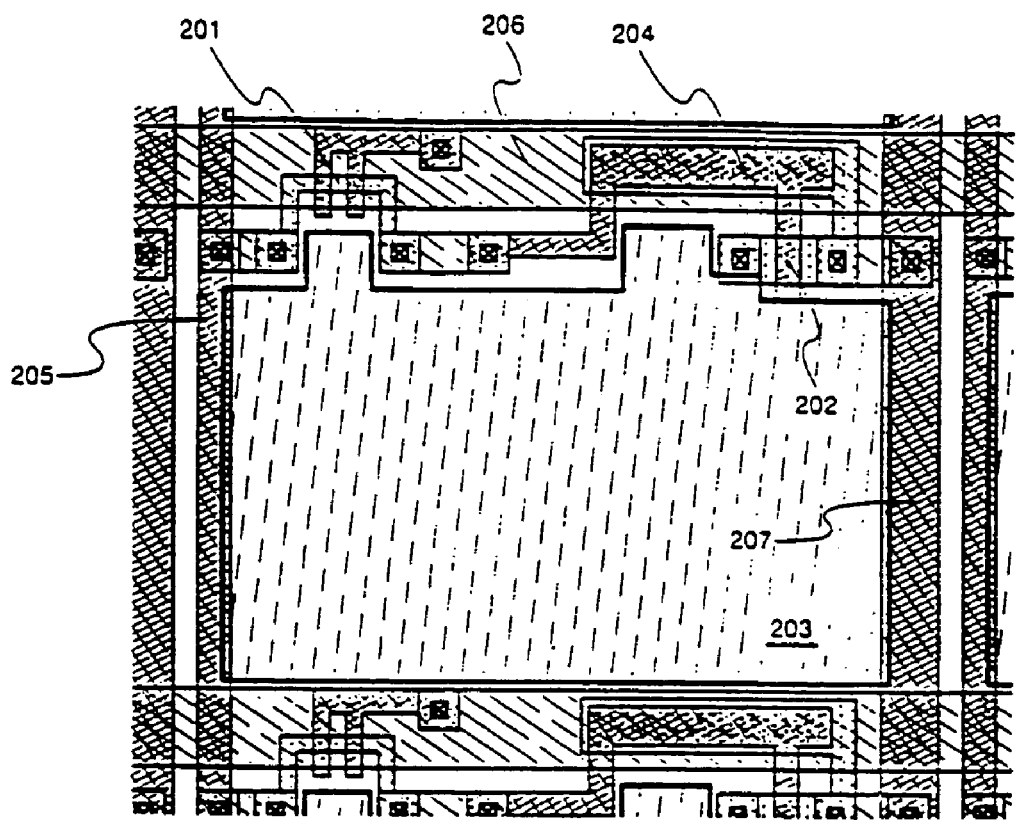
FIGS. 2A and 2B are, respectively, a plan view and a circuit diagram of a pixel of a structure having a dedicated electric current supply line and a gate signal line.
Figure 2B:
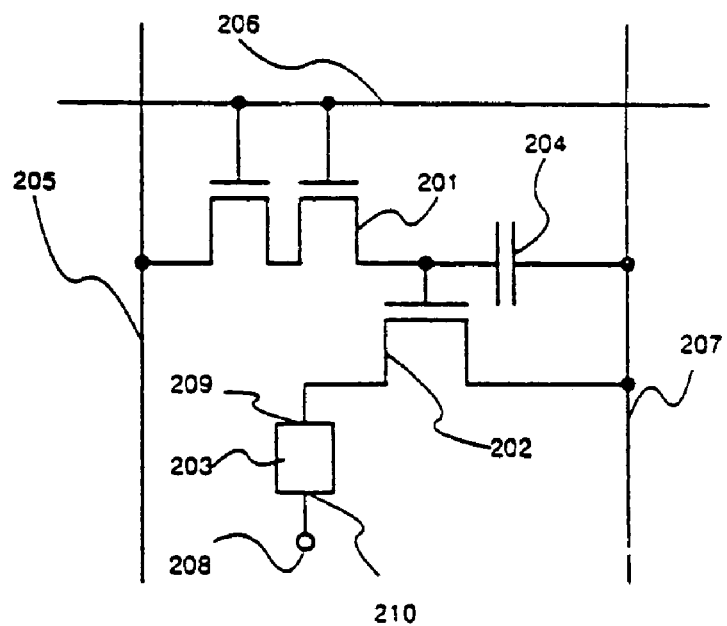

The present invention will be described with reference to FIGS. 1A to 2B. FIGS. 2A and 2B show an EL pixel having a normal construction, and FIGS. 1A and 1B show an EL pixel having the construction of the present invention. Each of FIG. 1A and FIG. 2A shows a pixel plan view, and each of FIG. 1B and FIG. 2B shows a pixel circuit diagram. In FIG. 2B, reference numerals 201, 202, and 203 respectively designate a switching TFT, an EL driving TFT, and an EL pixel. Reference numerals 204, 205, and 206 respectively designate a holding capacitor, a source signal line, and a gate signal line. Reference numerals 207, 208, 209 and 210 respectively designate an electric current supply line, a cathode electrode, an anode of the EL pixel, and a cathode of the EL pixel. In FIG. 1B, reference numerals 101, 102, and 103 respectively designate a switching TFT, an EL driving TFT, and an EL pixel. Reference numerals 104, 105, and 106 respectively designate a holding capacitor, a source signal line, and a gate signal line scanned in an i-th row. Reference numerals 108, 109, 110, and 111 respectively designate a cathode wiring, an anode of the EL pixel, a cathode of the EL pixel, and a gate signal line in a precedent adjacent row. As mentioned above, it is sufficient to determine polarities of the switching TFTs 101 and 201 may be determined in accordance with the structure of an EL element.

The switching TFTs in FIGS. 1A to 2B each have a double gate structure, but may also have a single gate structure, a triple gate structure or a multi-gate structure having more than three gates.

The gate signal line electrically connected to one of a source region and a drain region of the EL driving TFT is not necessarily set to a gate signal line in a precedent adjacent row.

In a conventional pixel construction, as shown in FIGS. 2A and 2B, the dedicated electric current supply source 207 is arranged, and a source electrode of the EL driving TFT 202 and an electrode of the holding capacitor 204 are connected to the electric current supply line 207. In contrast to this, in the present invention, as shown in FIG. 1, the source electrode of the EL driving TFT 102 and the electrode of the holding capacitor 104 are connected to the gate signal line 111 in another row. In this case, it is desirable to connect the source electrode of the TFT 102 and the electrode of the holding capacitor 104 to the gate signal line scanned one row before from the relation of an arrangement and the relation of voltages of the respective portions.

Figure 3:
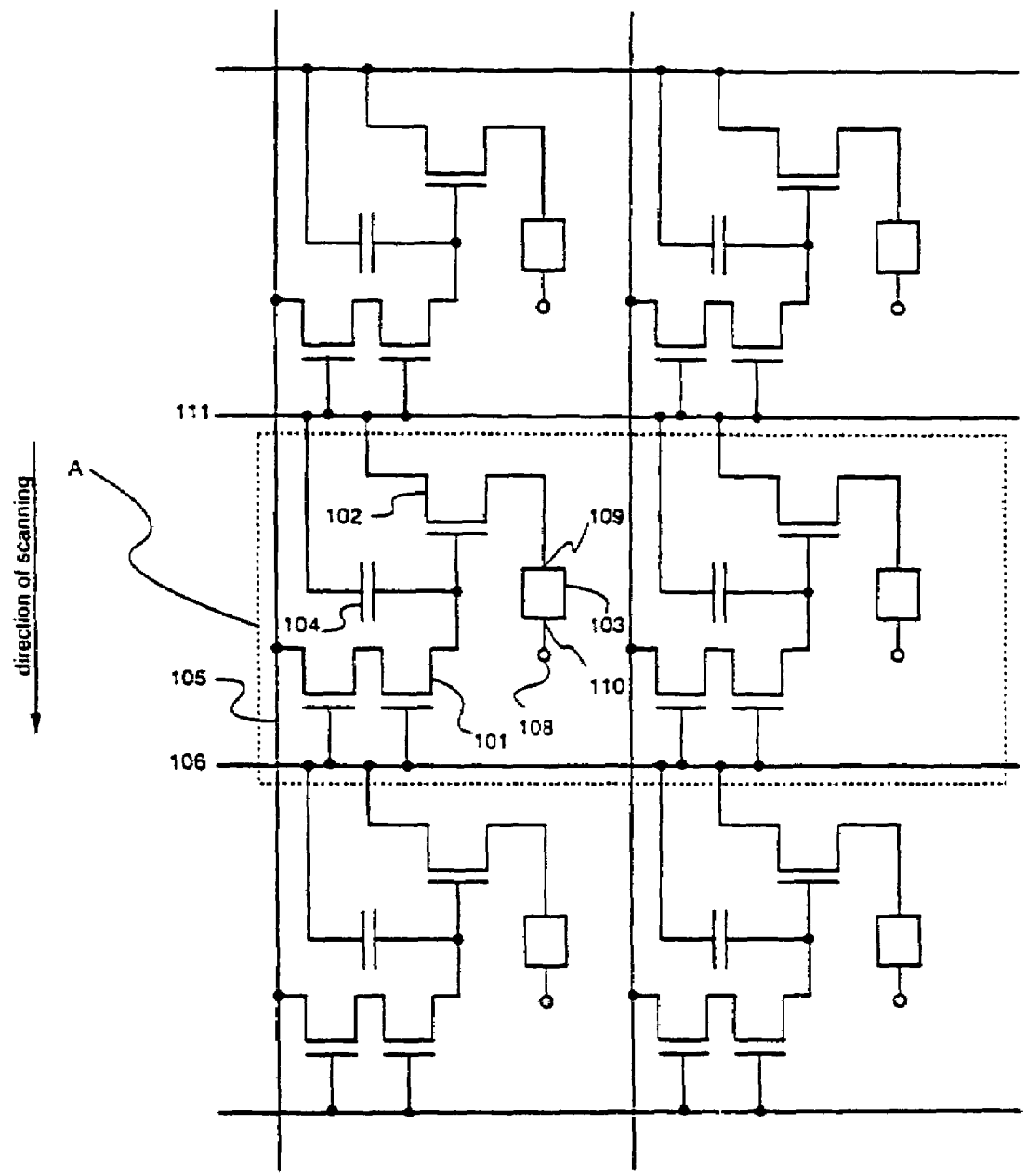
FIG. 3 is a circuit diagram showing a situation in which the pixels each having the structure having the common electric current supply line and gate signal line in the present invention are arranged in three rows and two columns.

FIG. 3 shows a circuit diagram in which pixels are arranged in three rows and two columns with respect to the circuit of one pixel shown in FIG. 1B. The pixels in FIG. 3 are similar to those in FIG. 1B. Therefore, reference numerals designated in FIG. 1B are also used in FIG. 3. In FIG. 3, a pixel portion controlled by the gate signal line 106 in an i-th row is surrounded by a dotted line frame shown by A. In this figure, only two columns of pixels are shown, but pixels are continuously arranged in a column direction by a number corresponding to the number of pixels in the horizontal direction of a panel. The source region of the EL driving TFT 102 and the electrode of the holding capacitor 104 are connected to the gate signal line 111 in an (i−1)-th row. Since the gate signal lines are sequentially scanned in a downward direction from an upper row in this figure, the gate signal line is connected to a gate signal line in the precedent row.

The point of the present invention is that the gate signal line in the precedent row is already returned to a not-selected state when a signal is being written into the row selected at present. An electric potential of the gate signal line is kept constant (in the not-selected state) until the gate signal line is again selected. Therefore, the present invention is characterized in that the gate signal line in the precedent row is treated as a constant electric potential line, i.e., an electric current supply line. Namely, the gate signal line and the electric current supply line are common. As a result, wiring number can be reduced and aperture ratio can be improved.

Figure 4:
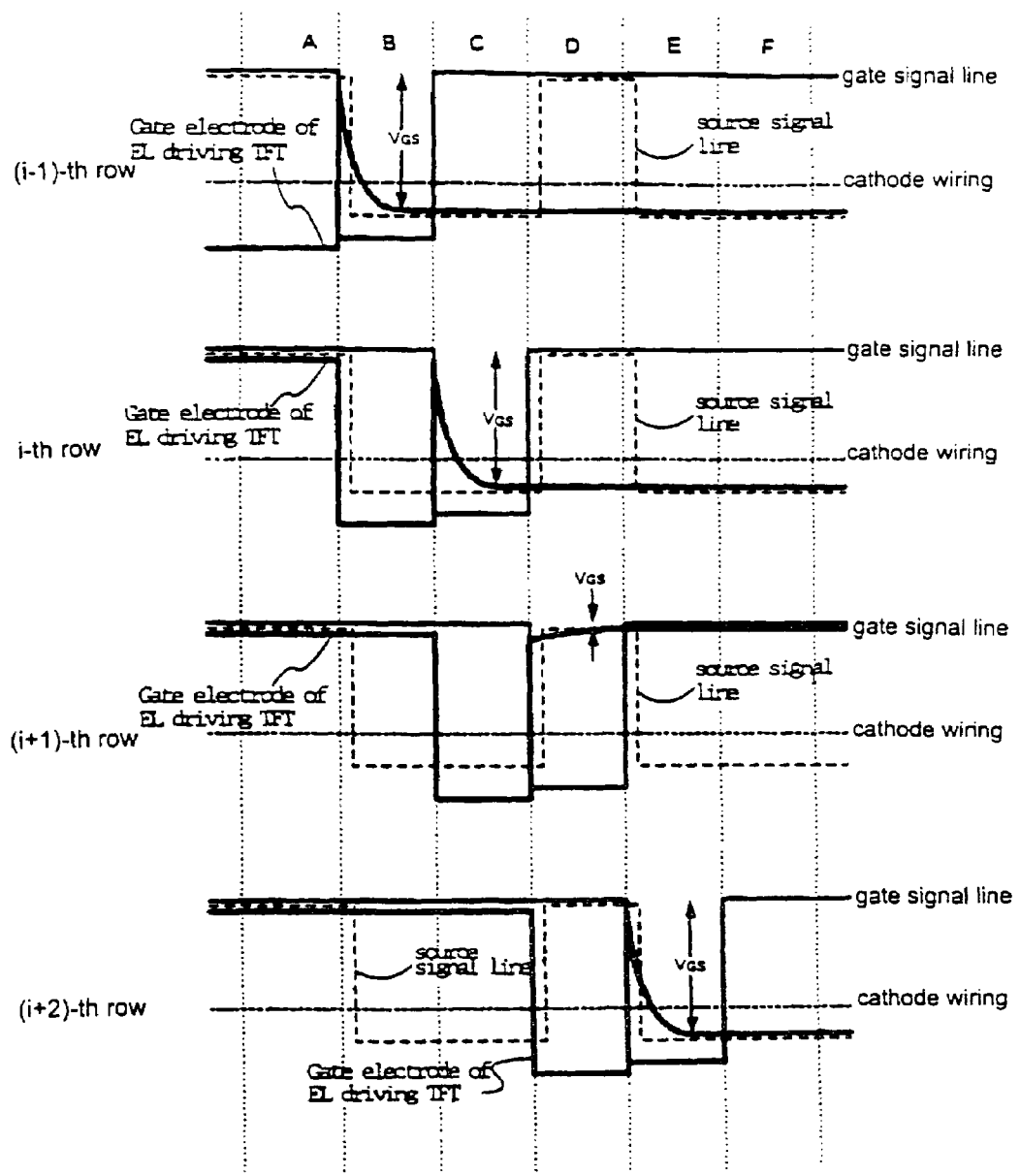
FIG. 4 is a view for explaining a basic signal pattern for using the pixel of the present invention.

FIG. 4 shows a basic signal pattern for driving the electro-optical device of the present invention shown in FIGS. 1A and 1B. Here, FIG. 4 shows an example in which the polarity of the switching TFT and the EL driving TFT is both p-channel type with respect to the electric potentials of the respective portions. FIG. 4 shows signal patterns in wirings in four rows from an (i−1)-th row to an (i+2)-th row in pixels in the same column (pixels connected to a certain one source signal line). For explanation, time is divided into a period A to a period F.

First, in each row, a gate signal line is selected and shifted to the next row. Since the switching TFT is of p-channel type, the switching TFT attains a turned-ON state when a voltage of the gate signal line is sufficiently lower than an electric potential of the source region of the switching TFT (namely, when $|V_{GS}|$ exceeds a threshold voltage of the switching TFT). It is necessary to set the voltage of the gate signal line at that time to be sufficiently lower than the lowest electric potential on a source signal line so that the voltage of the source signal line is written into a pixel. First, in the (i−1)-th row, the gate signal line is selected in a period B. In the i-th row, the gate signal line is selected in a period C. In the (i+1)-th row, the gate signal line is selected in a period D. In the (i+2)-th row, the gate signal line is selected in a period E. Thus, in each row, the gate signal line is selected and shifted to the next row.

The electric potential of the source signal line will next be described. Here, the pixel in each row is connected to the source signal line in a certain one column. Accordingly, the electric potential of the source signal line is the same from the (i−1)-th row to the (i+2)-th row. Here, in the periods A and D, the electric potential of the source signal line at the ends of the periods is in a high (Hi) signal state. In the periods B, C, E and F, the electric potential of the source signal line at the ends of the periods is in a low (LO) signal state. The actual electric potential of the source signal line has various values in accordance with a display pattern.

The electric potential of the gate electrode of the EL driving TFT in each pixel will next be described. The i-th row will first be considered. In a period prior to the period A, the electric potential of the gate electrode of the EL driving TFT in a pixel in the i-th row is in a high state. In the period B, the electric potential of the gate electrode of the EL driving TFT in the pixel in the i-th row is lowered. This is because one electrode of the holding capacitor in the i-th row is connected to the gate signal line in the (i−1)-th row, and the gate signal line in this (i−1)-th row is selected, and the voltage of the gate signal line in the (i−1)-th row is reduced. Namely, there are electric charges already accumulated in the holding capacitor, and a voltage according to these electric charges is applied to both terminals of the holding capacitor. In this state, one electrode of the holding capacitor, i.e., the voltage of the gate signal line in the (i−1)-th row is reduced. Thus, since the switching TFT in the i-th row is in a turned-OFF state, the electric charges of the holding capacitor in the pixel in the i-th row, i.e., the voltage of both the terminals of the holding capacitor is held as it is. The other electrode of the holding capacity, i.e., the voltage of the gate electrode of the EL driving TFT in the i-th row is also reduced to the same extent. Accordingly, the voltage of both the terminals of the holding capacitor, i.e., the voltage between the gate and the source of the EL driving TFT in the i-th row is not changed even when the voltage of the gate signal line in the (i−1)-th row is changed.

In this case, an absolute value of the voltage between the gate and the source of the EL driving TFT in the pixel in the i-th row is small in the period A so that no electric current flows through the EL element and the EL element is in a non light-emitting state. Accordingly, the electric potential of the gate electrode of the EL driving TFT is reduced in the period B, but the electric potential of the source electrode of the EL driving TFT is also simultaneously reduced. Therefore, the voltage between the gate and the source of the EL driving TFT is equal in the periods A and B. Accordingly, in the period B, no electric current flows through the EL element in the pixel in the i-th row. Even when the EL driving TFT is in a turned-ON state, it is assumed that the electric potential of the source electrode of the EL driving TFT is reduced and is lower than the electric potential of a cathode wiring of the EL element in the period B. Therefore, no forward bias voltage is applied to the EL element so that no electric current flows through the EL element. The voltage of the gate signal line in the (i−1)-th row is returned to the original state at the end of the period B. As a result, the electric potential of the gate electrode of the EL driving TFT in the pixel in the i-th row is also returned to the original state.

The period C is next started. In the period C, the gate signal line in the i-th row is selected. Accordingly, the electric potential of the gate electrode of the EL driving TFT in the pixel in the i-th row becomes the same as the electric potential of the source signal line. In the period C, the source signal line is set to a state of a low (LO) signal. Therefore, the electric potential of the gate electrode of the EL driving TFT in the pixel in the i-th row is also equal to the electric potential of the source signal line and is therefore low. At that time, one electrode of the holding capacitor, i.e., the a electric potential of the gate signal line in the (i−1)-th row is already returned to a high state. Therefore, the voltage between the gate signal line in the (i−1)-th row and the gate electrode of the EL driving TFT in the pixel in the i-th row is applied to the holding capacitor so that the absolute value of the voltage between the gate and the source of the EL driving TFT in the pixel in the i-th row is increased. Accordingly, the EL driving TFT in the pixel in the i-th row attains a turned-ON state. The electric potential of the gate signal line in the (i−1)-th row, i.e., the electric potential of the source electrode of the EL driving TFT in the pixel in the i-th row is already returned to a high state so that the electric potential of an anode of the EL element in the i-th row is higher than that of the cathode wiring. As a result, an electric current flows through the EL element in the i-th row and light is emitted from the EL element. The electric current flowing through the EL element in the i-th row is supplied through the gate signal line in the (i−1)-th row. Accordingly, it is necessary to set wiring resistance of the gate signal line in each row to be sufficiently low.

The period D is next started. In the period D, the voltage of the gate signal line in the i-th row is returned to the original state, and the switching TFT in the i-th row attains a turned- OFF state. The electric potential of the gate electrode of the EL driving TFT in the pixel in the i-th row is held as it is. At this time, the electric potential of the gate signal line in the (i−1)-th row, i.e., the electric potentials of the electrode of the holding capacitor in the pixel in the i-th row and the source electrode of the EL driving TFT are not changed from their present values. Accordingly, hereinafter, the EL driving TFT in the pixel in the i-th row attains a turned-ON state, and an electric current continuously flows through the EL element in the i-th row.

Similarly, an (i+1)-th row will be considered. In a period prior to the period B, the electric potential of the gate electrode of the EL driving TFT in the pixel in the (i+1)-th row is in a high state. In the period C, the electric potential of the gate electrode of the EL driving TFT in the pixel in the (i+1)-th row is reduced. This is because one electrode of the holding capacitor in the (i+1)-th row is connected to the gate signal line in the i-th row, and the gate signal line in this i-th row is selected, and the voltage of the gate signal line in the i-th row is reduced. At the end of the period C, the voltage of the gate signal line in the i-th row is returned to the original state, and the electric potential of the gate electrode of the EL driving TFT in the pixel in the (i+1)-th row is also returned to the original state.

The period D is next started. In the period D, the gate signal line in the (i+1)-th row is selected. Accordingly, the electric potential of the gate electrode of the EL driving TFT in the pixel in the (i+1)-th row becomes the same as the electric potential of the source signal line. In the period D, the source signal line is in a high (H) signal state. Accordingly, the electric potential of the gate electrode of the EL driving TFT in the pixel in the (i+1)-th row becomes the same electric potential as the source signal line, and also becomes Hi. At that time, one electrode of the holding capacitor, i.e., the electric potential of the gate signal line in the i-th row is already returned to a high state. Accordingly, the voltage between the gate signal line in the i-th row and the gate electrode of the EL driving TFT in the pixel in the (i+1)-th row is applied to the holding capacitor so that the absolute value of the voltage between the gate and the source of the EL driving TFT is reduced. Accordingly, the EL driving TFT in the pixel in the (i+1)-th row attains a turned-OFF state, and no electric current flows through the EL element in the (i+1)-th row, and no light is emitted from the EL element.

The period E is next started. In the period E, the voltage of the gate signal line in the (i+1)-th row is returned to the original state, and the switching TFT in the (i+1)-th row attains a not-selected state. The electric potential of the gate electrode of the EL driving TFT in the pixel in the (i+1)-th row is held as it is. The electric potential of the gate signal line in the i-th row, i.e., the electric potentials of the electrode of the holding capacitor in the pixel in the (i+1)-th row and the source electrode of the EL driving TFT are not changed from their present values. Accordingly, hereinafter, the EL driving TFT in the pixel in the (i+1)-th row attains a turned-OFF state, and a state in which no electric current flows through the EL element in the (i+1)-th row lasts.

Similarly, an (i+2)-th row will be considered. In a period prior to the period C, the electric potential of the gate electrode of the EL driving TFT in the pixel in the (i+2)-th row is set to a low state. In the period D, the electric potential of the gate electrode of the EL driving TFT in the pixel in the (i+2)-th row is reduced. This is because one electrode of the holding capacitor in the (i+2)-th row is connected to the gate signal line in the (i+1)-th row, and the gate signal line in this (i+1)-th row is selected, and the voltage of the gate signal line in the (i+1)-th row is reduced. In a period prior to the period C, the absolute value of the voltage between the gate and the source of the EL driving TFT in the pixel in the (i+2)-th row is large so that an electric current flows through the EL element in the pixel in the (i+2)-th row, and a light emitting state is reached. In the period D, the electric potential of the gate electrode of the EL driving TFT is reduced, but the electric potential of the source electrode of the EL driving TFT is also simultaneously reduced. Therefore, the voltage between the gate and the source of the EL driving TFT in a period prior to the period C is equal to that in the period D. Even when the EL driving TFT is in a turned-ON state, the electric potential of the source electrode of the EL driving TFT is reduced and is lower than the electric potential of the cathode wiring of the EL element in the period D so that no electric current flows through the EL element. At the end of the period D, the voltage of the gate signal line in the (i+1)-th row is returned to the original state. As a result, the electric potential of the gate electrode of the EL driving TFT in the pixel in the (i+2)-th row is also returned to the original state.

The period E is next started. In the period E, the gate signal line in the (i+2)-th row is selected. Accordingly, the electric potential of the gate electrode of the EL driving TFT in the pixel in the (i+2)-th row becomes the same as the electric potential of the source signal line. In the period E, the source signal line is set to a low (L) signal state. Therefore, the electric potential of the gate electrode of the EL driving TFT in the pixel in the (i+2)-th row becomes the same electric potential as the source signal line, and also becomes Lo. At that time, one electrode of the holding capacitor, i.e., the electric potential of the gate signal line in the (i+1)-th row is already returned to a high state. Accordingly, the voltage between the gate signal line in the (i+1)-th row and the gate electrode of the EL driving TFT in the pixel in the (i+2)-th row is applied to the holding capacitor so that the absolute value of the voltage between the gate and the source of the EL driving TFT is increased. Accordingly, the EL driving TFT in the pixel in the (i+2)-th row attains a turned-ON state, an electric current flows through the EL element in the (i+2)-th row, and light is emitted from the EL element. The electric current flowing through the EL element in the (i+2)-th row is supplied through the gate signal line in the (i+1)-th row.

Next, the period F is started. In the period F, the voltage of the gate signal line in the (i+2)-th row is returned to the original state, and the switching TFT in the (i+2)-th row attains a turned-OFF state. The electric potential of the gate electrode of the EL driving TFT in the pixel in the (i+2)-th row is held as it is. The electric potential of the gate signal line in the (i+1)-th row, i.e., the electric potentials of the electrode of the holding capacitor in the pixel in the (i+2)-th row and the source electrode of the EL driving TFT are not changed from their present values. Accordingly, hereinafter, the EL driving TFT in the pixel in the (i+2)-th row attains a turned-ON state, and an electric current continuously flows through the EL element in the (i+2)-th row.

If the above operations are repeatedly performed, an electric current is supplied to the EL element through the gate signal line by connecting the source electrode of the EL driving TFT 102 and the electrode of the holding capacitor 104 to the gate signal line in another row so that the EL element can be operated.

The polarity of the TFT will next be described.

These polarities are set as in the conventional case in the case of the EL driving TFT. Namely, either an n-channel type TFT or a p-channel type TFT may be used. However, the p-channel type is desirable in consideration of source grounding being preferable as the operation of a transistor, a restriction in manufacture of the EL element, etc.

It is necessary to set the polarity for the switching TFT by the electric potential of the gate signal line. Namely, when the gate signal line and an anode electrode of the EL element are connected to each other through the EL driving TFT, it is necessary to set the electric potential of the gate signal line to be higher than that of cathode wiring in order to cause an electric current to flow through the EL element. Accordingly, it is necessary to use the p-channel type so as to set the gate signal line to have a high electric potential in a turned-OFF state in the switching TFT. On the other hand, if the gate signal line and a cathode electrode of the EL element are connected to each other through the EL driving TFT, it is necessary to use the n-channel type TFT for the switching TFT.

The present invention can be adapted to each of an analog gray scale system and a digital gray scale system.

Embodiments of the present invention will next be described.

Embodiment 1

Figure 5A:
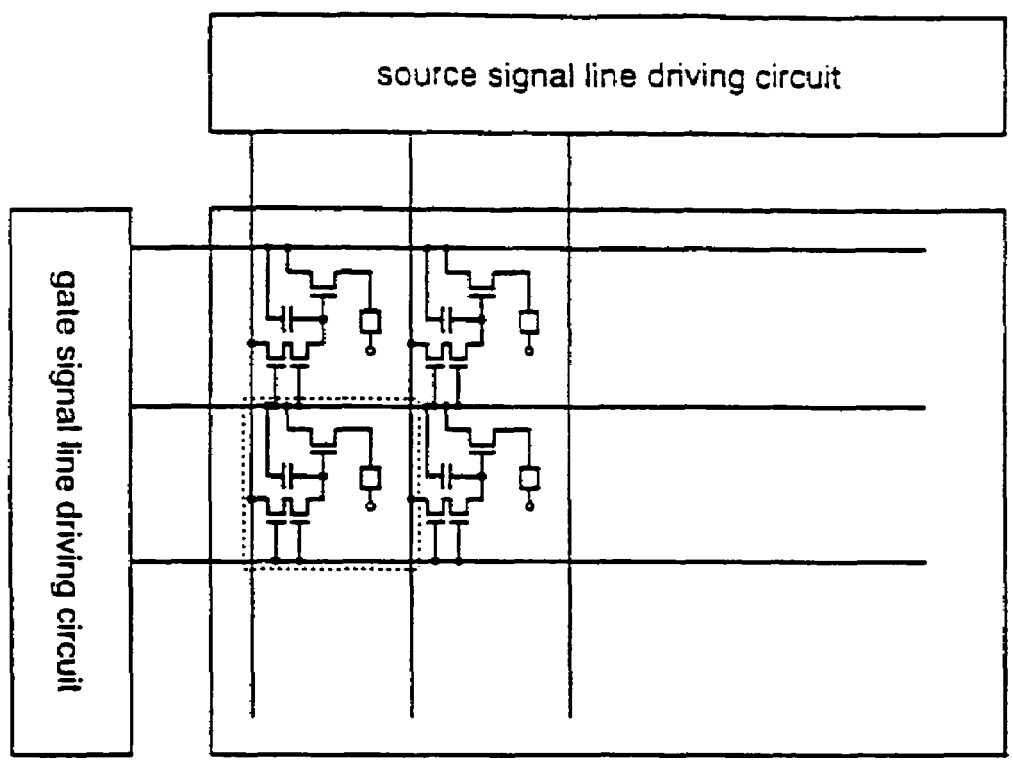
FIGS. 5A and 5B are diagrams showing a circuit constructional example of an electro-optical device having the pixel of the present invention and shown in an embodiment 1.
Figure 5B:
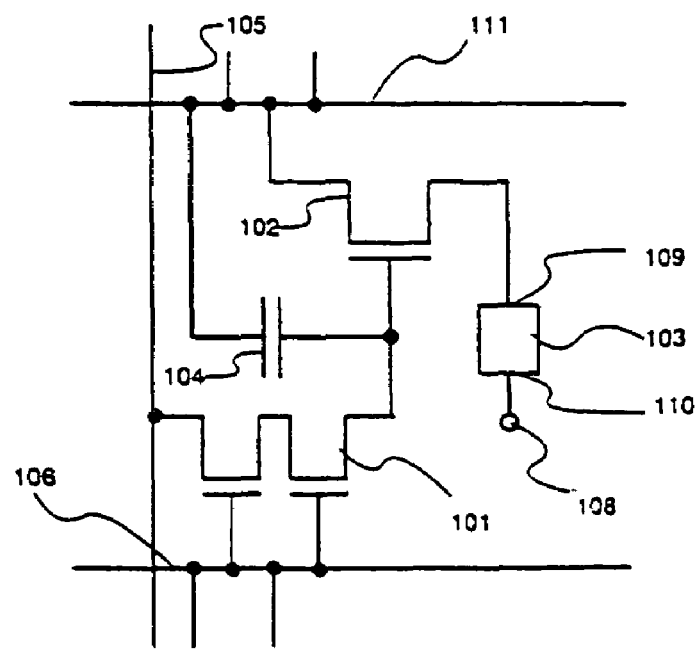

FIG. 5A shows a circuit constructional example of the entire electro-optical device in which a pixel portion is arranged at the center of this circuit. A circuit diagram of one pixel is a portion surrounded by a dotted line frame 500 in FIG. 5A. FIG. 5B shows the circuit diagram. Reference numerals designated within FIG. 5B are the same as FIG. 1B. A gate signal line side driving circuit for controlling the operations of gate signal lines 106, 111 is arranged on the left-hand side of this circuit diagram. When gate signal line side driving circuits are symmetrically arranged on both the left-hand and right-hand sides of the pixel portion although this arrangement is not shown, more effective drive can be obtained. A source signal line side driving circuit is arranged on the upper side of this circuit diagram to control an operation of the source signal line 105.

A signal inputted to the source signal line 105 may be of digital quantity of analog quantity. In other words, the present invention can be applied to the case of digital gray scale and the case of analog gray scale.

Figure 6:
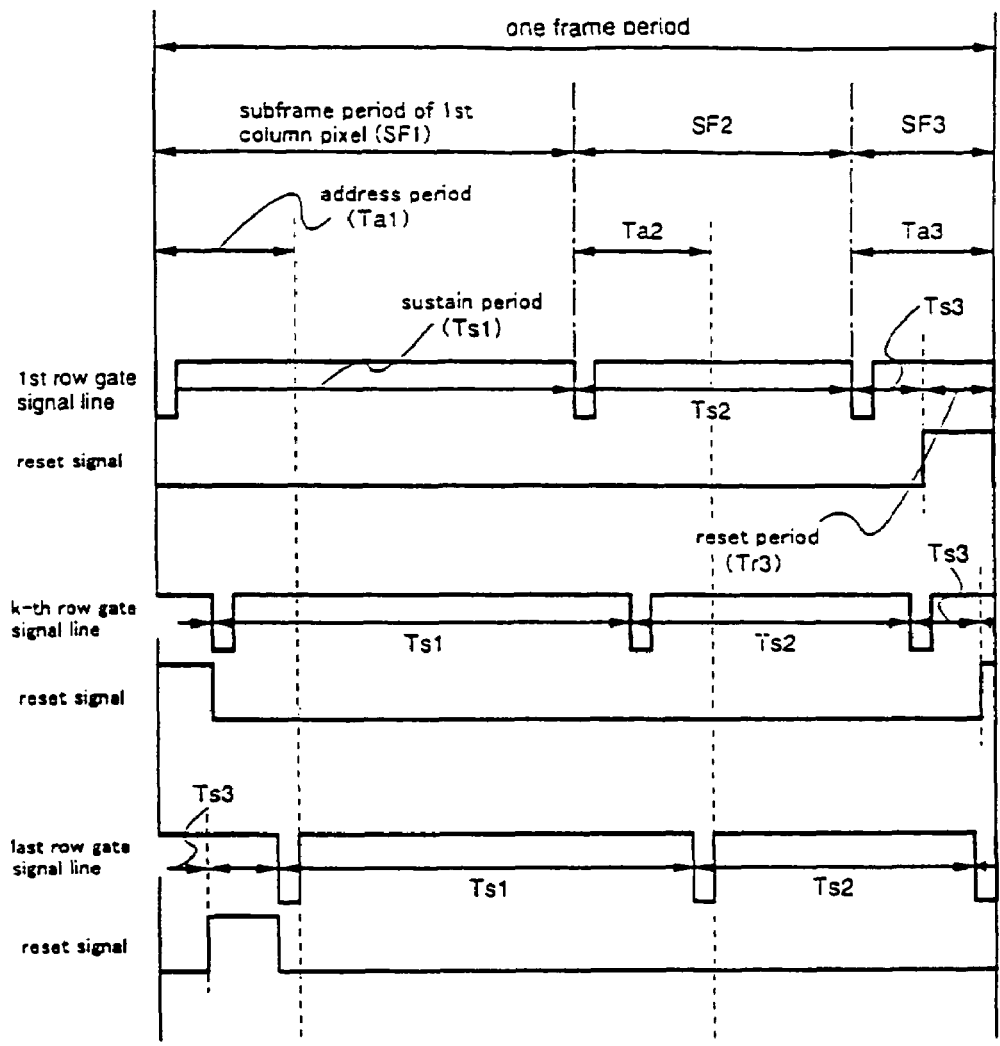
FIG. 6 is a timing chart for explaining an example of driving the electro-optical device having the pixel of the present invention and shown in the embodiment 1.
Figure 6:
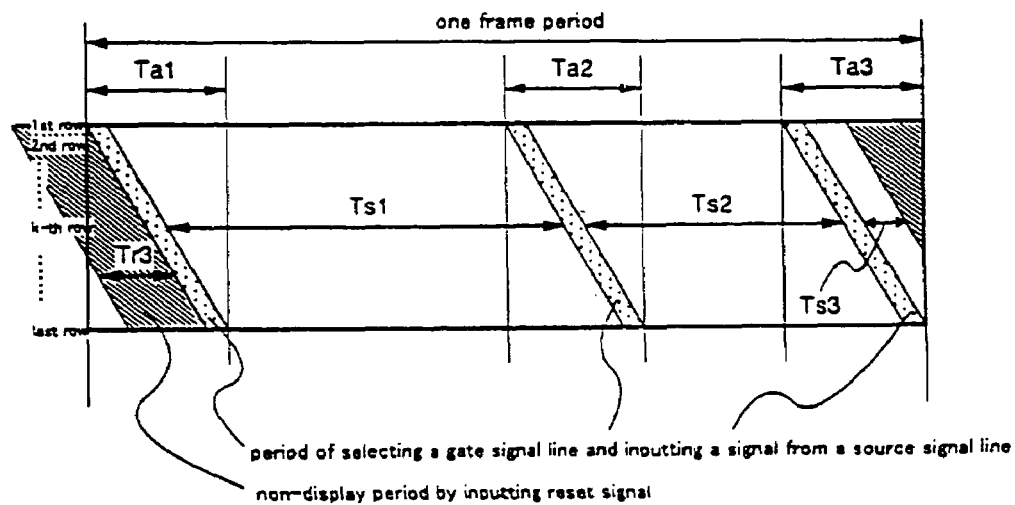
Figure 7:
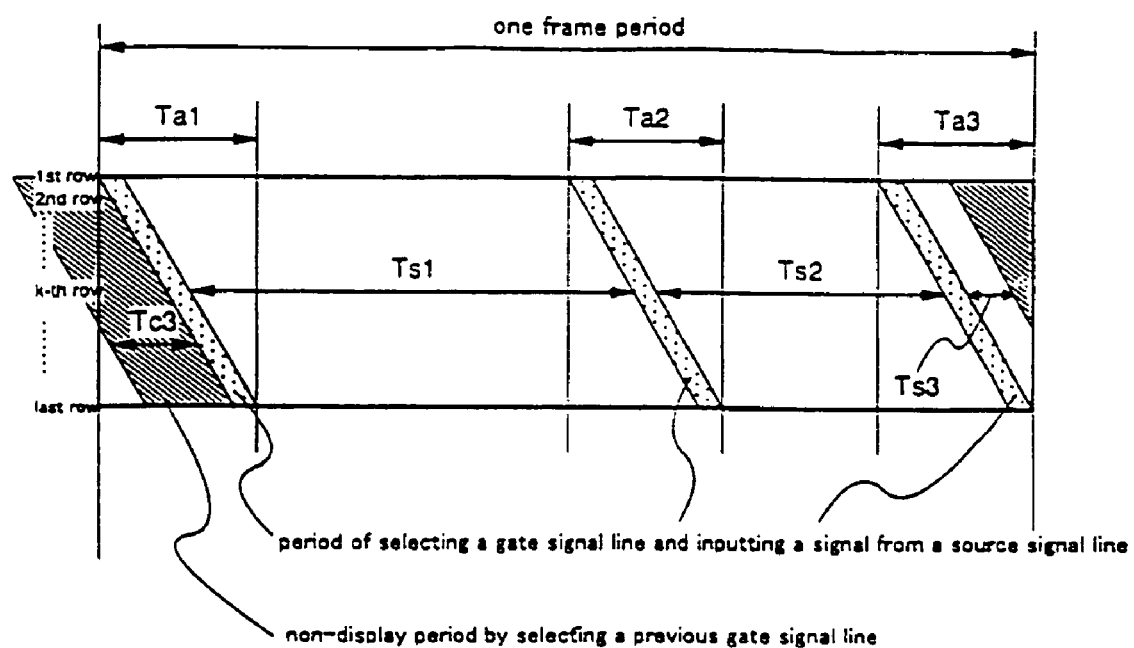
FIG. 7 is a timing chart for explaining an example of driving the electro-optical device having the pixel of the present invention and shown in the embodiment 1.

The next description relates to a case in which gray scale of k bits ($2^k$) is obtained by combining the digital gray scale and time gray scale. For brevity, gray scale of three bits ($2^3$=8) will be described as an example. FIGS. 6 and 7 show timing charts showing the electric potentials of the gate signal lines in the rows. A case in which the p-channel type is selected for the polarity of the TFTs for constituting the pixel, i.e., for the polarity of both the switching TFT and the EL driving TFT is taken as an example.

In the construction of the timing chart, first, one frame period is divided into three subframe periods $SF_1$ to $SF_3$. In each of the subframe periods, there are address (write) periods $Ta_1$ to $Ta_3$, and sustain (lighting) periods $Ts_1$ to $Ts_3$. Time intervals of the $Ts_1$ to $Ts_3$ are set to be changed by power of 2. Namely, $Ts_1:Ts_2:Ts_3=4:2:1$ is set.

First, a signal is inputted to pixels row by row. In this case, the gate signal line 106 is selected, and the signal is inputted to the pixel through the source signal line 105. This operation is performed from a first row of the gate signal line to its final row.

Here, the address period is a period from the selection of the gate signal line in the first row to the selection of the gate signal line in the final row. Accordingly, the time interval of the address period is the same during any subframe period.

$SF_2$ is next started. The gate signal line 106 is similarly selected and a signal is inputted to the pixels through the source signal line 105. This operation is performed from a first row of the gate signal line to its final row.

In the meantime, the electric potential of the cathode wiring 108 is constant. Therefore, the sustain period of each pixel is defined as a period from the time when a signal is written into the pixel in a certain subframe period to the time when a signal is written into the pixel in the next subframe period. Accordingly, timing of the sustain period varies in different rows in a certain subframe period, but its time interval is all the same.

$SF_3$ is next started. The gate signal line 106 is similarly selected and a signal is inputted to a pixel through the source signal line 105. In the $SF_3$, the address period $Ta_3$ is longer than the sustain period $Ts_3$. Therefore, if the period, of $Ts_3$ is terminated and the address period $Ta_1$ in the subframe $SF_1$ in the next frame period is immediately started, gate signal lines in different two rows are simultaneously selected, so that signals in the two rows can not be normally inputted simultaneously. Therefore, after the period of $Ts_3$ is terminated, the electric potential of the gate signal line in the precedent row is sequentially increased starting from the first row. Namely, the gate signal line in the precedent row is set to a selected state. Then the voltage application to the EL elements is sequentially ceased from the pixels in the first row, and the EL elements stop emitting light. However, since gate signal lines in a plurality of rows are simultaneously selected at this time, a signal is also inputted to an unrelated row. However, in reality, no voltage is applied to the EL elements in the unrelated rows and the EL elements do not emit light. Accordingly, it is not necessary to consider such a case. When the address period $Ta_3$ is terminated and the next address period $Ta_1$ is started, it is returned to the normal operation. Thus, the time interval of the sustain period $Ts_3$ can be controlled. A period for setting a non-display period by increasing the electric potential of the gate signal line in the precedent row is called a clear period ($Tc_n$, n: a number designated to the subframe period).

When the sustain period is shorter than the address period as in the above, a period from termination of the sustain period to termination of the address period or starting of the next address period is set to the clear period. Thus, the time interval of the sustain period can be freely set even when the sustain period is shorter than the address period.

Embodiment 2

In this embodiment, a method of forming TFT of a driving circuit (a source signal line side driving circuit, a gate signal line side driving circuit, etc.) arranged in the periphery of the pixel portion, a switching TFT of the pixel portion and the EL driving TFT on the same substrate will be explained step by step in detail as an example of a method of forming the electro-optical device explained in the embodiment 1. For brevity of the explanation, a CMOS circuit is illustrated as a basic constructional circuit of a driving circuit portion, and the switching TFT and the EL driving TFT are illustrated as the pixel portion.

First, as shown in FIG. 8A, a base film 5002 formed of an insulating film such as a silicon oxide film, a silicon nitride film or a silicon nitride oxide film is formed on a substrate 5001 formed of glass such as barium borosilicate glass or alumino borosilicate glass represented by #7059 glass and #1737 glass of CORNING Corporation, etc. For example, a silicon nitride oxide film 5002a formed from $SiH_4$, $NH_3$ and $N_2O$ by the plasma CVD method and having a thickness of from 10 to 200 [nm] (preferably 50 to 100 [nm]) is formed. Similarly, a hydrogenerated silicon nitride oxide film 5002b formed from $SiH_4$ and $N_2O$ and having a thickness of from 50 to 200 [nm] (preferably 100 to 150 [nm]) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization or a known thermal crystallization on a semiconductor film having an amorphous structure. These island-like semiconductor layers 5003 to 5006 each have a thickness of from 25 to 80 [nm] (preferably 30 to 60 [nm]). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and a $YVO_4$ laser of a pulse oscillation type or continuous light emitting type are used. When these lasers are used, it is preferable to use a method in which a laser beam radiated from a laser emitting device is converged into a linear shape by an optical system and then is irradiated to the semiconductor film. A crystallization condition is suitably selected by an operator. When the excimer laser is used, pulse oscillation frequency is set to 30 [Hz], and laser energy density is set to from 100 to 400 [mJ/cm$^2$] (typically 200 to 300 [mJ/cm$^2$]. When the YAG laser is used, pulse oscillation frequency is preferably set to from 1 to 10 [kHz] by using its second harmonic, and laser energy density is preferably set to from 300 to 600 [mJ/cm$^2$](typically 350 to 500 [mJ/cm$^2$]). The laser beam converged into a linear shape and having a width of from 100 to 1000 [μm], e.g. 400 [μm] is, is irradiated to the entire substrate face. At this time, overlapping ratio of the linear laser beam is set to from 80 to 98[%].

Next, a gate insulating film 5007 covering the island-like semiconductor layers 5003 to 5006 is formed. The gate insulating film 5007 is formed from an insulating film containing silicon and having a thickness of from 40 to 150 [nm] by using the plasma CVD method or a sputtering method. In this embodiment, the gate insulating film 5007 is formed from a silicon nitride oxide film of 120 [nm] in thickness. However, the gate insulating film is not limited to such a silicon nitride oxide film, but it may be an insulating film containing other and having a single layer or a laminated layer structure. For example, when a silicon oxide film is used, TEOS (Tetraethyl Orthosilicate) and $O_2$ are mixed by the plasma CVD method, the reaction pressure is set to 40 [Pa], the substrate temperature is set to from 300 to 400[° C.], and the high frequency (13.56 [MHz]) power density is set to from 0.5 to 0.8 [W/cm$^2$] for electric discharge. Thus, the silicon oxide film can be formed by discharge. The silicon oxide film manufactured in this way can then obtain preferable characteristics as the gate insulating film by thermal annealing at from 400 to 500[° C.].

A first conductive film 5008 and a second conductive film 5009 for forming a gate electrode are formed on the gate insulating film 5007. In this embodiment, the first conductive film 5008 having a thickness of from 50 to 100 [nm] is formed from Ta, and the second conductive film 5009 having a thickness of from 100 to 300 [nm] is formed from W.

The Ta film is formed by a sputtering method, and the target of Ta is sputtered by Ar. In this case, when suitable amounts of Xe and Kr are added to Ar, internal stress of the Ta film is released, and pealing off of this film can be prevented. Resistivity of the Ta film of α phase is about 20 [μΩcm], and this Ta film can be used for the gate electrode. However, resistivity of the Ta film of β phase is about 180 [μΩcm], and is not suitable for the gate electrode. When tantalum nitride having a crystal structure close to that of the α phase of Ta and having a thickness of about 10 to 50 [nm] is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride ($WF_6$). In any case, it is necessary to reduce resistance to use this film as the gate electrode. It is desirable to set resistivity of the W film to be equal to or smaller than 20 [μΩcm]. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999[%] in purity is used, and the W film is formed by taking a sufficient care of not mixing impurities from a gaseous phase into the W film time when the film is to be formed. Thus, a resistivity of from 9 to 20 [μΩcm] can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polycrystal silicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu. It is particularly preferable to form the first conductive film 5008 and the second conductive film 5009 by using a combination that allows for a selection ratio by etching (See FIG. 8A).

Next, a mask 5010 is formed from a resist, and first etching processing for forming an electrode and wiring is performed. In this embodiment, an ICP (Inductively Coupled Plasma) etching method is used, and $CF_4$ and $Cl_2$ are mixed with a gas for etching. RF (13.56 [MHz]) power of 500 [W] is applied to the electrode of coil type at a pressure of 1 Pa so that plasma is generated. RF (13.56 [MHz]) of 100 [W] power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15 to 45°. It is preferable to increase an etching time by a ratio of about 10 to 20[%] so as to perform the etching without leaving the residue on the gate insulating film. Since a selection ratio of a silicon nitride oxide film to the W film ranges from 2 to 4 (typically 3); an exposed face of the silicon nitride oxide film is etched by about 20 to 50 [nm] by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 [nm] in the gate insulating film 5007, so that a thinned region is formed.

Then, an impurity element for giving an n-type conductivity is added by performing first doping processing. A doping method may be either an ion doping method or an ion implantation method. The ion doping method is carried out under the condition that a dose is set to from $1\times10^{13}$ to $5\times10^{14}$ [atoms/cm$^2$], and an acceleration voltage is set to from 60 to 100 [keV]. An element belonging to group 15, typically, phosphorus (P) or arsenic (As) is used as the impurity element for giving the n-type conductivity. However, phosphorus (P) is used here. In this case, the conductive layers 5011 to 5015 serve as masks with respect to the impurity element for giving the n-type conductivity, and first impurity regions 5017 to 5025 are formed in a self-aligning manner. The impurity element for giving the n-type conductivity is added to the first impurity regions 5017 to 5025 in a concentration range from $1\times10^{20}$ to $1\times10^{21}$ [atoms/cm$^3$]. (See FIG. 8B).

Second etching processing is next performed. The ICP etching method is similarly used, so that $CF_4$, $Cl_2$ and $O_2$ are mixed with an etching gas, and RF power (13.56 [MHz]) of 500 [W] is supplied to the electrode of coil type at a pressure of 1 [Pa] to generate plasma. RF (13.56 [MHz]) power of 50 [W] is applied to the substrate side (sample stage), and a lower self bias voltage is applied in comparison with the self bias voltage in the first etching processing. Anisotropic etching of a W film is performed under such a condition, and anisotropic etching of the Ta film as the first conductive layer is performed at an etching speed slower than that of the anisotropic etching of the W film so that conductive layers 5026 to 5031 of a second shape (first conductive layers 5026a to 5031a and second conductive layers 5026b to 5031b) are formed. A region of the gate insulating film 5007 which is not covered with the conductive layers 5026 to 5031 of the second shape is further etched by about 20 to 50 [nm] so that a thinned region is formed. (See FIG. 8C).

An etching reaction in the etching of the W film using the mixed gas of $CF_4$ and $Cl_2$ and the Ta film can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions are generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

Figure 9A:
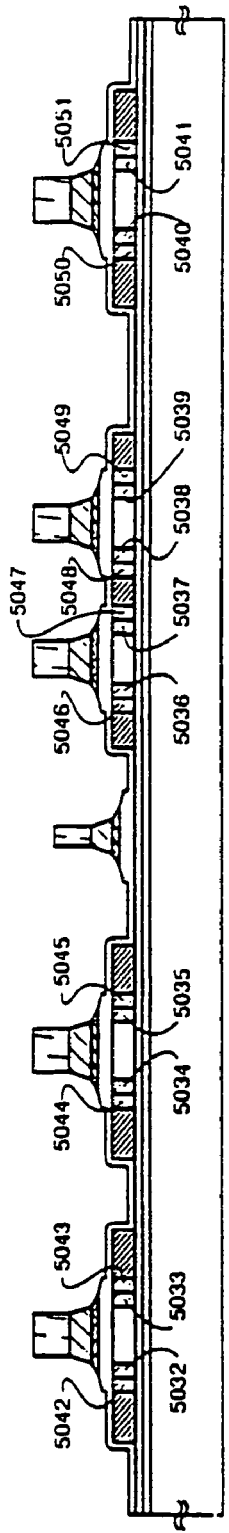
FIGS. 9A to 9C are diagrams showing the manufacturing process example of the electro-optical device shown in the embodiment 2.

As shown in FIG. 9A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 [keV], and the dose is set to $1\times10^{13}$ [atoms/cm$^2$]. Thus, a new impurity region is formed inside the first impurity region formed in the island-like semiconductor layer in FIG. 8B. In the doping, the conductive layers 5026 to 5030 of the second shape are used as masks with respect to the impurity element, and the doping is performed such that the impurity element is also added to regions underside the first conductive layers 5026a to 5030a. Thus, third impurity regions 5032 to 5041 overlapped with the first conductive layers 5026a to 5030a, and second impurity regions 5042 to 5051 between the first and third impurity regions are formed. The impurity element for giving the n-type conductivity is doped such that the concentration of the impurity element ranges from $1\times10^{17}$ to $1\times10^{19}$ [atoms/cm$^3$] in the second impurity region, and the concentration of the impurity element ranges from $1\times10^{16}$ to $1\times10^{18}$ [atoms/cm$^3$] in the third impurity region.

Figure 9B:
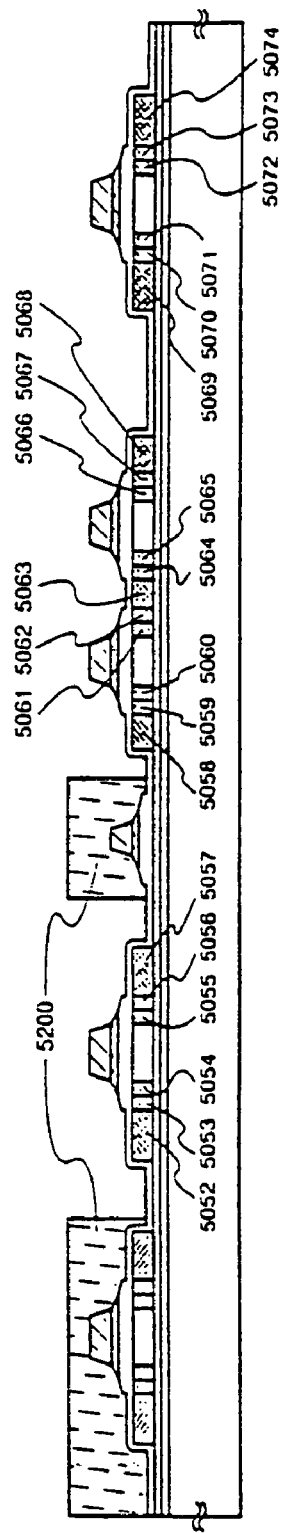

As shown in FIG. 9B, fourth impurity regions 5052 to 5074 having a conductivity type reverse to the one conductivity type are formed in island-like semiconductor layers 5004, 5005, 5006 for forming a p-channel type TFT. The second conductive layers 5012 to 5015 are used as masks with respect to the impurity element, and the impurity regions are formed in a self-aligning manner. At this time, the entire faces of the island-like semiconductor layer 5003 for forming the n-channel type TFT, and the second conductive layer 5031 for forming wiring are covered with a resist mask 5200 in advance. Phosphorus is added to each of impurity regions 5052 to 5054, 5055 to 5057, 5058 to 5060, 5061 to 5065, 5066 to 5068, 5069 to 5071, and 5072 to 5074 at different concentrations. However, these regions are formed by the ion doping method using diborane ($B_2H_6$), and the impurity concentration is set to from $2\times10^{20}$ to $2\times10^{21}$ [atoms/cm$^3$] in each of these regions.

The impurity regions are formed in each of the island-like semiconductor layers through the above steps. The conductive layers 5026 to 5030 of the second shape overlapped with the island-like semiconductor layers function as the gate electrode. Further, the region 5031 functions as a signal line.

Figure 9C:
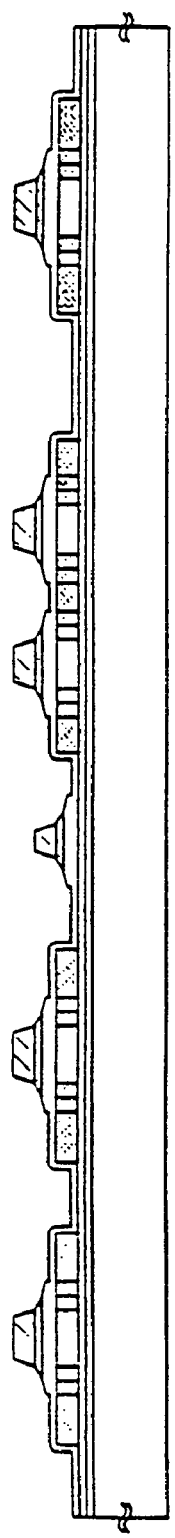

As shown in FIG. 9C, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700[° C.], typically from 500 to 600[° C.] within a nitrogen atmosphere in which oxygen concentration is equal to or smaller than 1 [ppm] and is preferably equal to or smaller than 0.1 [ppm]. In this embodiment, heat treatment is performed for four hours at a temperature of 500[° C.]. When a wiring material used in layers 5026 to 5031 is weak against heat, it is preferable to perform activation after an interlayer insulating film (having silicon as a principal component) is formed in order to protect wiring, etc.

Further, the heat treatment is performed for 1 to 12 hours at a temperature of from 300 to 450[° C.] within an atmosphere including 3 to 100[%] of hydrogen so that the island-like semiconductor layer is hydrogenerated. This step is to terminate a dangling bond of the semiconductor layer by hydrogen thermally excited. Plasma hydrogenation (using hydrogen excited by plasma) may also be performed as another measure for hydrogeneration.

Figure 10A:
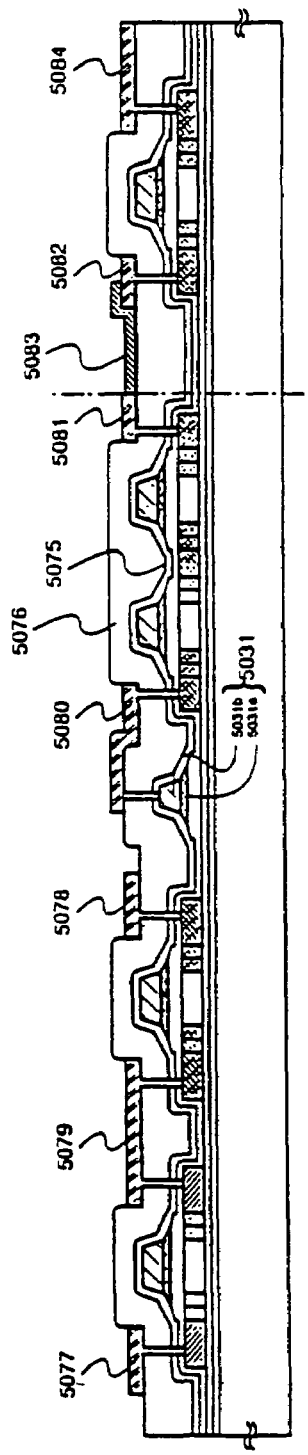
FIGS. 10A and 10B are diagrams showing the manufacturing process example of the electro-optical device shown in the embodiment 2.

As shown in FIG. 10A, a first interlayer insulating film 5075 is next formed. For the first interlayer insulating film 5075, a single layer of insulating film containing silicon is used, or a laminate film provided by combining two kinds or more of insulating films containing silicon is used. The film thickness thereof is set to from 400 [nm] to 1.5 [μm]. In this embodiment, a silicon oxide nitride film of 200 [nm] in thickness is formed. An activation may be executed by the furnace annealing method, the laser annealing method or a lamp annealing method. In this embodiment, the heat treatment is performed for four hours at 550[° C.] within a nitrogen atmosphere in an electrothermal furnace.

At this time, the first interlayer insulating film fulfills a function for preventing oxidation of the gate electrode.

Further, the heat treatment is performed for 1 to 12 hours at a temperature of from 300 to 450° C. within an atmosphere including 3 to 100% of hydrogen, whereby hydrogeneration processing is performed. This step is a process in which a dangling bond of the semiconductor film is terminated by hydrogen thermally excited. Plasma hydrogeneration (using hydrogen excited by plasma) may also be performed as another measure for hydrogeneration.

When a laminate film is used as the first interlayer insulating film 5075, the hydrogeneration processing may also be performed between the step of forming one layer and the step of forming another layer.

Figure 10B:
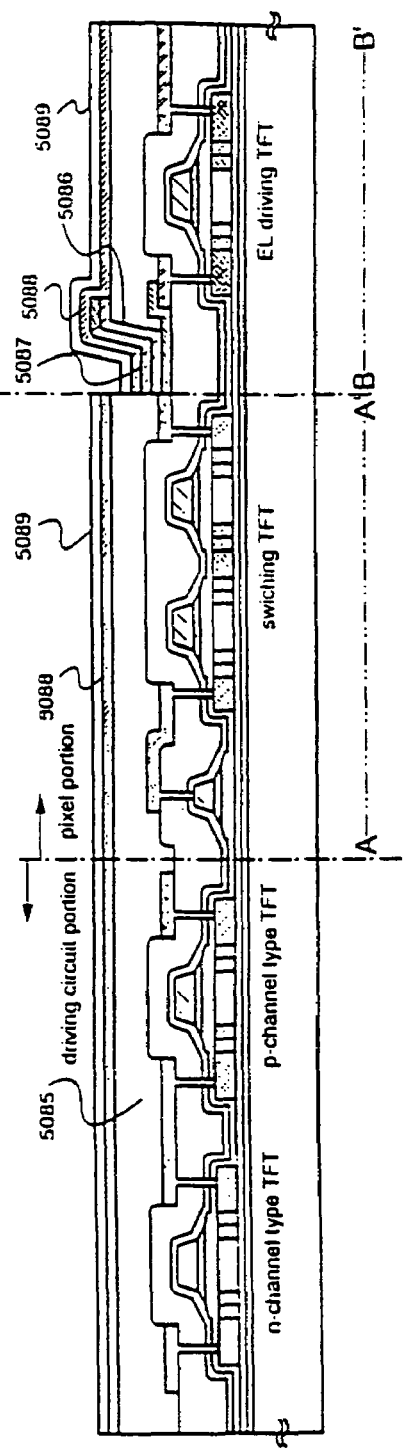

When the activation step is completed, as shown in FIG. 10B, a second interlayer insulating film 5076 is formed. Thereafter, contact holes are formed through the first interlayer insulating film 5075, the second interlayer insulating film 5076 and the gate insulating film 5007. Wirings (including a connecting electrode) 5077 to 5082, and a gate signal line 5084 are patterned and formed. Thereafter, a pixel electrode 5083 coming in contact with the connecting electrode 5082 is patterned and formed.

A film having an organic resin as a material is used as the second interlayer insulating film 5076. Polyimide, polyamide, acrylic, BCB (benzocyclobutene), etc. can be used as this organic resin. In particular, since the second interlayer insulating film 5076 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 [μm] (is further preferably set to from 2 to 4 [μm]).

In the formation of the contact holes, contact holes reaching n-type impurity regions 5018 to 5026 or p-type impurity regions 5054 to 5065, a contact hole reaching wiring 5032, a contact hole reaching an electric current supply line 5033, and unillustrated contact holes reaching gate electrodes 5029, 5030 are formed by using dry etching or wet etching.

Further, a laminate film of a three-layer structure is patterned in a desired shape and is used as wirings (including a connecting electrode and a signal line) 5077 to 5082, 5084. In this three-layer structure, a Ti film of 100 [nm] in thickness, a Ti-containing aluminum film of 300 [nm] in thickness, and a Ti film of 150 [nm] in thickness are continuously formed by the sputtering method. However, another conductive film may also be used.

When a circuit having a pixel construction of the present invention is constructed, the gate signal line is formed by utilizing one portion of the laminate film of the above three-layer structure, and is also used as the electric current supply line. Accordingly, a material of low resistance (e.g., a material having aluminum, copper, etc. as a principal component) is desirably used.

In this embodiment, an ITO film of 110 [nm] in thickness is formed as a pixel electrode 5083, and is patterned. Contact is made by arranging the pixel electrode 5083 such that this pixel electrode 5083 comes in contact with the connecting electrode 5082 and is overlapped with this connecting electrode 5082. Further, a transparent conductive film provided by mixing 2 to 20% of zinc oxide (ZnO) with indium oxide may also be used. This pixel electrode 5083 becomes an anode of the EL element.

As shown in FIG. 10B, an insulating film (a silicon oxide film in this embodiment) containing silicon and having a thickness of 500 [nm] is next formed. A third interlayer insulating film 5085 is formed in which an opening is formed in a position corresponding to the pixel electrode 5083. When the opening is formed, a side wall of the opening can easily be tapered by using the wet etching method. When the side wall of the opening is not gentle enough, deterioration of an EL layer caused by a level difference becomes a notable problem.

Next, an EL layer 5086 and a cathode (MgAg electrode) 5087 are continuously formed by using the vacuum evaporation method without exposing to the atmosphere. The EL layer 5086 has a thickness of from 80 to 200 [nm] (typically from 100 to 120 [nm]), and the cathode 5087 has a thickness of from 180 to 300 [nm] (typically from 200 to 250 [nm]).

In this process, the EL layer and the cathode are sequentially formed with respect to a pixel corresponding to red, a pixel corresponding to green and a pixel corresponding to blue. In this case, since the EL layer has an insufficient resistance against a solution, the EL layer must be formed separately for each color instead of using a photolithography technique. Therefore, it is preferable to cover a portion except for desired pixels using a metal mask so that the EL layer and the cathode are formed selectively only in a required portion.

Namely, a mask for covering all portions except for the pixel corresponding to red is first set, and the EL layer and the cathode for emitting red light are selectively formed by using this mask. Next, a mask for covering all portions except for the pixel corresponding to green is set, and the EL layer and the cathode for emitting green light are selectively formed by using this mask. Next, a mask for covering all portions except for the pixel corresponding to blue is similarly set, and the EL layer and the cathode for emitting blue light are selectively formed by using this mask. Here, different masks are used, but instead the same single mask may be used repeatedly. It is preferable to perform processing without breaking a vacuum until the EL layer and the cathode are formed with respect to all the pixels.

Here, a system for forming three kinds of EL elements corresponding to RGB is used. However, a system in which an EL element for emitting white light and a color filter are combined, a system in which the EL element for emitting blue or blue green light is combined with a fluorescent substance (a fluorescent color converting layer: CCM), a system for overlapping the EL elements respectively corresponding to R, G, and B with the cathodes (opposite electrodes) by utilizing a transparent electrode, etc. may be used.

A known material can be used as the EL layer 5086. An organic material is preferably used as the known material in consideration of a driving voltage. For example, a four-layer structure consisting of a hole injection layer, a hole transportation layer, a light emitting layer and an electron injection layer is preferably used for the EL layer. In this embodiment, an MgAg electrode is used as the cathode of the EL element as an example, but another known material may also be used.

Next, a protective electrode 5088 is formed so as to cover the EL layer and the cathode. An conductive film having aluminum as a principal component is used as this protective electrode 5088. The protective electrode 5088 is formed by the vacuum evaporation method using a mask different from the one used when the EL layer and the cathode are formed. After the EL layer and the cathode are formed, the protective electrode 5088 is preferably formed continuously without exposing the formed films to the atmosphere.

Finally, a passivation film 5089 formed of a silicon nitride film and having a thickness of 300 [nm] is formed. In reality, the protective film 5088 plays a role of protecting the EL layer from moisture, etc. However, reliability of the EL element can be further improved by forming the passivation film 5089.

Thus, an active matrix type electro-optical device having a structure as the one shown in FIG. 10B is completed. In FIG. 10B, portions indicated by A-A' and B-B' correspond to A-A' and B-B' sections in FIG. 1A, respectively.

In the process of forming the active matrix type electro-optical device in this embodiment, the source signal line is formed from Ta and W that are materials of the gate electrodes, and the gate signal line is formed from Al that is a wiring material of the source and drain electrodes for conveniences of the circuit construction and procedures in the process. However, different materials may also be used.

The active matrix type electro-optical device in this embodiment has very high reliability and improved operating characteristics by arranging the TFTs of the optimal structures in a driving circuit portion in addition to the pixel portion. Further, in a crystallization process, crystallinity can be also improved by adding a metal catalyst such as Ni. Thus, a driving frequency of the source signal line driving circuit can be set to 10 [MHz] or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, a GOLD region, an LDD region and a channel forming region. The GOLD region is overlapped with the gate electrode through the gate insulating film.

Deterioration by the hot carrier injection in the p-channel type TFT of the CMOS circuit is almost neglectible. Therefore, it is not necessary to particularly form the LDD region in this p-channel type TFT. However, similar to the n-channel type TFT, the LDD region can be formed as a hot carrier countermeasure.

Further, when the CMOS circuit for bidirectionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a construction in which the LDD region is partially overlapped with the gate electrode through the gate insulating film. The transmission gate used in the dot sequential driving can be given also as an example of the TFT as such.

In reality, when the electro-optical device reaches the state of FIG. 10B, it is preferable to perform packaging (sealing) using a protective film (a laminate film, an ultraviolet curable resin film, etc.) that has a high airtight seal property and allows little degasification and a translucent sealing member in order to prevent the EL element from being exposed to the outside air. In this case, reliability of the EL element is improved by filling the interior of the sealing member with an inert gas atmosphere and arranging a moisture absorbing material (e.g., barium oxide) therein.

Further, after the airtight seal property is improved by processing of packaging, etc., a connector (flexible printed circuit: FPC) is attached to complete the device as a product. The connector is for connecting, with an external signal terminal, a terminal led out from the element or the circuit which is formed on the substrate. The device in this state is ready to be shipped and is called an EL display (or EL module) in this specification.

Embodiment 3

In this embodiment, a manufacturing example of the electro-optical device of the present invention will be explained.

Figure 11A:
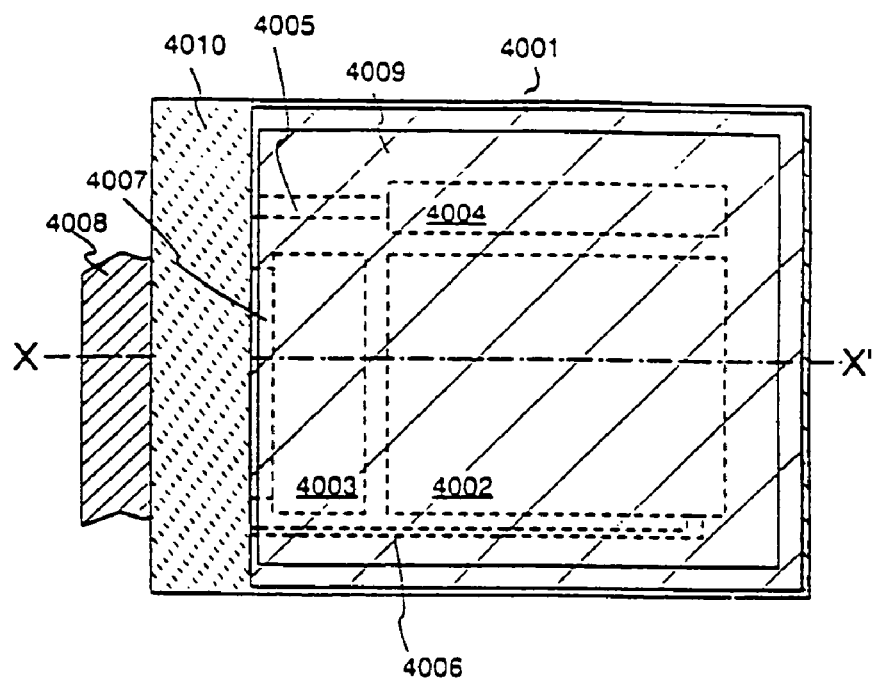
FIGS. 11A and 11B are, respectively, a plan view and a cross-sectional view of the electro-optical device shown in an embodiment 3.
Figure 11B:
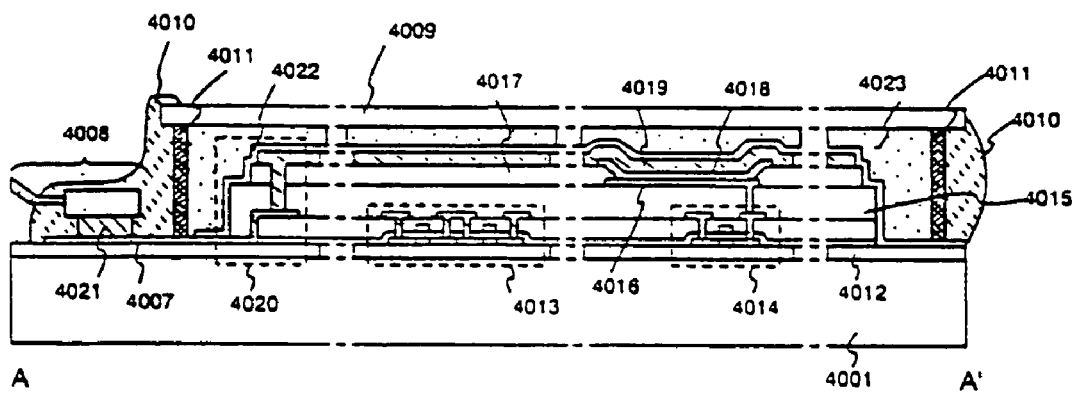

FIG. 11A is a top view of the electro-optical device using the present invention. FIG. 11B shows a cross-sectional view cut by the X-X' plane of FIG. 11A. In FIG. 11A, reference numerals 4001, 4002, 4003 and 4004 respectively designate a substrate, a pixel portion, a source signal line side driving circuit and a gate signal line side driving circuit. The respective driving circuits reach an FPC 4008 via wirings 4005, 4006, 4007 and are connected to an external device.

At this time, a cover member 4009, a sealant 4010 and a sealing member (also called a housing member) 4011 (shown in FIG. 11B) are arranged such that these members surround at least the pixel portion, preferably the driving circuits and the pixel portion.

FIG. 11B shows a sectional structure of the electro-optical device in this embodiment. A TFT 4013 for the driving circuits (a CMOS circuit obtained by combining the n-channel TFT and the p-channel TFT is illustrated here) and a TFT 4014 for the pixel portion (only an EL driving TFT for controlling an electric current to the EL element is illustrated here) are formed on the substrate 4001 and a base film 4012. A known structure (a top gate structure or a bottom gate structure) is used in these TFTs.

When the TFT 4013 for the driving circuits and the TFT 4014 for the pixel portion are completed by using a known manufacturing method, a pixel electrode 4016 electrically connected to a drain of the TFT 4014 for the pixel portion is formed from a transparent conductive film on an interlayer insulating film (leveling film) 4015 formed of a resin material. A compound (called an ITO) of indium oxide and tin oxide or a compound of indium oxide and zinc oxide can be used as the transparent conductive film. After the pixel electrode 4016 is formed, an insulating film 4017 is formed and an opening is formed on the pixel electrode 4016.

An EL layer 4018 is next formed. The EL layer 4018 may be a single layer structure film of a known EL material (a hole injection layer, a hole transportation layer, a light emitting layer, an electron transportation layer or an electron injection layer), or may be a laminate structure film of any combination of known EL materials. The structure of the EL layer 4018 is determined by using a known technique. EL materials are divided into monomer-based materials and polymer-based materials in the EL material. When the monomer-based material is used, the evaporation method is used. On the other hand, when the polymer-based material is used, a simple method such as a spin coat method, a printing method or an ink jet method can be used.

In this embodiment, the EL layer is formed by the evaporation method using a shadow mask. Color display can be performed by forming a light emitting layer (a red light emitting layer, a green light emitting layer and a blue light emitting layer) in which different wavelengths of light is emitted for different groups of pixels by using the shadow mask. In addition to this, there are a system in which a color converting layer (CCM) and a color filter are combined, and a system in which a white light emitting layer is combined with a color filter, and any method of these systems may also be used. Further, it is also possible to construct an electro-optical device for emitting monochromatic light.

After the EL layer 4018 is formed, a cathode 4019 is formed on the EL layer 4018. It is desirable to remove moisture and oxygen existing on an interface of the cathode 4019 and the EL layer 4018 as much as possible. Accordingly, it is necessary to take a measure in which the EL layer 4018 and the cathode 4019 are continuously formed in vacuum, or a measure in which the EL layer 4018 is formed in an inert gas atmosphere and then the cathode 4019 is formed without exposing the films to the atmosphere. In this embodiment, the above film formation can be performed by using a film forming apparatus of multi-chamber system (cluster tool system).

In this embodiment, a laminating structure of a LiF (lithium fluoride) film and an Al (aluminum) film is used as the cathode 4019. Concretely, the LiF (lithium fluoride) film of 1 [nm] in thickness is formed on the EL layer 4018 by the evaporation method, and the aluminum film of 300 [nm] in thickness is formed on the LiF film. The MgAg electrode that is a known cathode material may also be used. The cathode 4019 is connected to wiring 4007 in a region denoted by reference numeral 4020. The wiring 4007 is a power line for giving a predetermined voltage to the cathode 4019, and is connected to the FPC 4008 through an conductive paste material 4021.

It is necessary to form a contact hole through the interlayer insulating film 4015 and the insulating film 4017 in order to electrically connect the cathode 4019 and the wiring 4007 in the region denoted by reference numeral 4020. These holes may be formed the time of etching the interlayer insulating film 4015 (when forming the contact hole for the pixel electrode), or at the time of etching the insulating film 4017 (when forming an opening before the formation of the EL layer). Alternatively, the contact hole may be formed when the insulating film 4017 is etched by etching the insulating film 4017 until it reaches to the inter layer insulating film 4015. In this case, if the interlayer insulating film 4015 and the insulating film 4017 are formed of the same resin material, the contact hole can have a preferable shape.

The passivation film 4022, a filler 4023 and the cover member 4009 are formed so as to cover the surface of the EL element formed in this way.

Further, a sealing member 4011 is arranged between the cover member 4009 and the substrate 4001 so as to surround the EL element portion. Further, a sealant (second sealing member) 4010 is formed outside the sealing member 4011.

At this time, this filler 4023 also functions as an adhesive for adhering the cover member 4009. PVC (polyvinyl chloride), epoxy resin, silicone resin, PVB (polyvinyl butyral) or EVA (ethylenevinyl acetate) can be used as the filler 4023. When a drying agent is arranged within this filler 4023, a moisture absorbing effect can be maintained, which is preferable. Deterioration of the EL layer may be suppressed also by arranging an anti-oxidizer having effects of capturing oxygen, etc. within the filler 4023.

Further, a spacer may also be included within the filler 4023. At this time, the spacer may be formed from a granular substance comprised of BaO, etc., so that the spacer itself can have a moisture absorbing property.

When the spacer is arranged, the passivation film 4022 can release a spacer pressure. Further, a resin film for releasing the spacer pressure may also be arranged separately from the passivation film.

A glass plate, an aluminum plate, a stainless steel plate, an FRP (Fiberglass-Reinforced Plastics) plate, a PVF (polyvinyl fluoride) film, a Mylar film, a polyester film or an acrylic film can be used as the cover member 4009. When the PVB or the EVA is used as the filler 4023, it is preferable to use a sheet having a structure in which an aluminum foil of several ten [μm] in thickness is sandwiched between the PVF films or the Mylar films.

In this case, the cover member 4009 may have to be light transmissive depending on a light emitting direction (a light radiating direction) from the EL element.

The wiring 4007 is electrically connected to the FPC 4008 through the gap between the sealing member 4011 and the substrate 4001, and the gape between the sealant 4010 and the substrate 4001. Here, the wiring 4007 is explained, but other wirings 4005, 4006 are similarly electrically connected to the FPC 4008 through portions below the sealing member 4011 and the sealant 4010.

In this embodiment, the filler 4023 is arranged, and then the cover member 4009 is adhered and the sealing member 4011 is attached so as to cover the side faces (exposed faces) of the filler 4023. However, the filler 4023 may also be arranged after the cover member 4009 and the sealing member 4011 are attached. In this case, a filler injection port communicated with the gap between the substrate 4001 and the cover member 4009 and the gape between the substrate 4001 and the sealing member 4011 is formed. These gaps are brought into a vacuum state (equal to or smaller than $10^{-2}$ [Torr]), and the injecting port is dipped into a reservoir filled with the filler. Thereafter, the atmospheric pressure outside the gaps is set to be higher than the atmospheric pressure inside the gaps, so that the gaps are filled with the filler.

Embodiment 4

In this embodiment, an example in which an electro-optical device different from Embodiment 3 is manufactured, is described with reference to FIGS. 12(A) and 12(B). Since the same reference numerals as those in FIGS. 11(A) and 11(B) denote the same portions, an explanation is omitted.

Figure 12A:
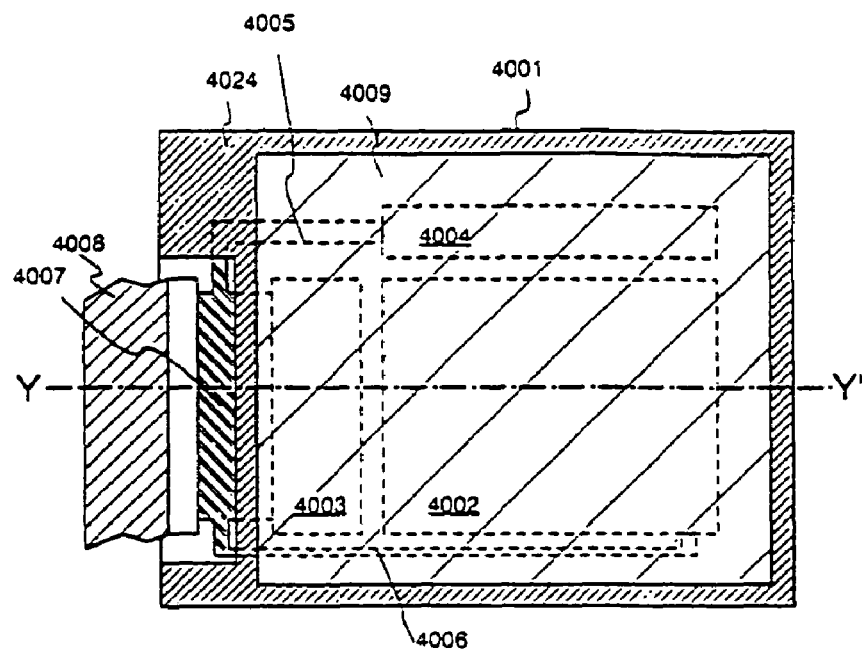
FIGS. 12A and 12B are, respectively, a plan view and a cross-sectional view of an electro-optical device shown in an embodiment 4.
Figure 12B:
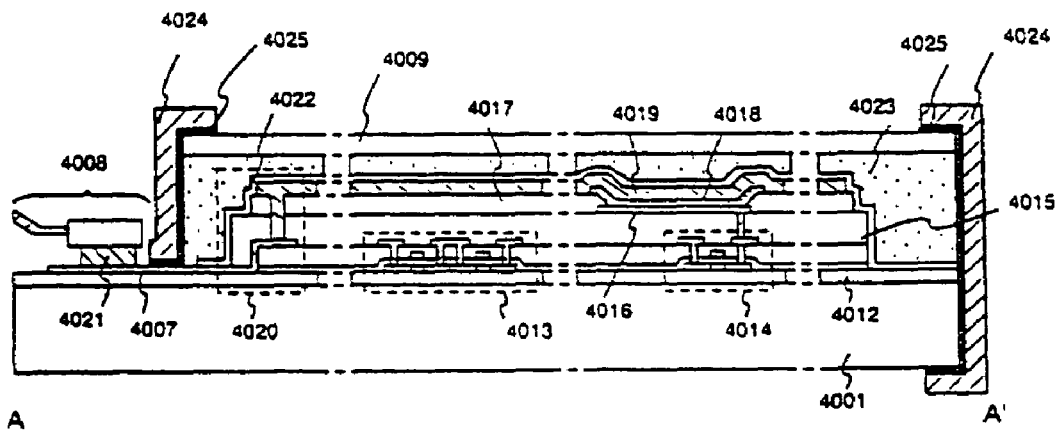

FIG. 12A is a top view of an electro-optical display device of this embodiment. FIG. 12B is a sectional view of the electro-optical display device taken along line A-A' of FIG. 12A.

In accordance with Embodiment 3, steps are carried out until a passivation film 4022 covering the surface of an EL element is formed.

Further, a filler 4023 is provided so as to cover the EL element. This filler 4023 functions also as an adhesive for bonding a cover member 4009. As the filler 4023, PVC (polyvinyl chloride), epoxy resin, silicone resin, PVB (polyvinyl butyral) or EVA (ethylene-vinyl acetate) can be used. It is preferable that a drying agent is provided in the inside of this filler 4023, since a moisture absorption effect can be held. It is also preferable that antioxidant or the like which can capture oxygen, is provided in the inside of this filler 4023, since deterioration of the EL layer can be prevented.

A spacer may be contained in the filler 4023. At this time, the spacer is a granular material made of BaO or the like, thereby the spacer itself may be made to have a moisture absorption property.

In the case where the spacer is provided, the passivation film 4022 can relieve spacer pressure. In addition to the passivation film, a resin film or the like for relieving the spacer pressure may be provided.

As the cover member 4009, a glass plate, an aluminum plate, a stainless plate, an FRP (Fiberglass-Reinforced Plastics) plate, a PVF (polyvinyl fluoride) film, a Mylar film, a polyester film, or an acrylic film can be used. In the case where PVB or EVA is used for the filler 4023, it is preferable to use a sheet of a structure in which an aluminum foil of several tens of [μm] is interposed between PVF films or Mylar films.

However, according to the direction of light emission (radiation direction of light) from the EL element, it is necessary that the cover member 6000 has transparency.

Next, after the cover member 4009 is bonded by using the filler 4023, a frame member 4024 is attached so as to cover the side (exposed surface) of the filler 4023. The frame member 4024 is bonded by a sealing member (functioning as an adhesive) 4025. At this time, as the sealing member 4025, although it is preferable to use a photo-curing resin, if heat resistance of the EL layer permits, a thermosetting resin may be used. Incidentally, it is desirable that the sealing member 4025 is a material which is as impermeable as possible to moisture and oxygen. A drying agent may be added in the inside of the sealing member 4025.

Further a wiring 4007 is electrically connected to an FPC 4008 through a gap between the sealing member 4025 and a substrate 4001. Here, although description is made on the wiring 4007, other wirings 4005 and 4006 are also electrically connected to the FPC 4008 through a space under the sealing member 4025 in the same manner.

In Embodiment 4, the cover member 4009 is bonded after forming the filler 4023, and the frame member 4024 is attached so as to cover the side surfaces (exposed surfaces) of the filler 4023, but the filler 4023 may also be formed after attaching the cover member 4009, sealing member 4025, and the frame member 4024. In this case, a filler injection opening is formed through a gap formed by the substrate 4001, the cover member 4009, sealing member 4025 and the frame member 4024. The gap is set into a vacuum state (a pressure equal to or less than $10^{-2}$ Torr), and after immersing the injection opening in the tank holding the filler, the air pressure outside of the gap is made higher than the air pressure within the gap, and the filler fills the gap.

Embodiment 5

Figure 13:
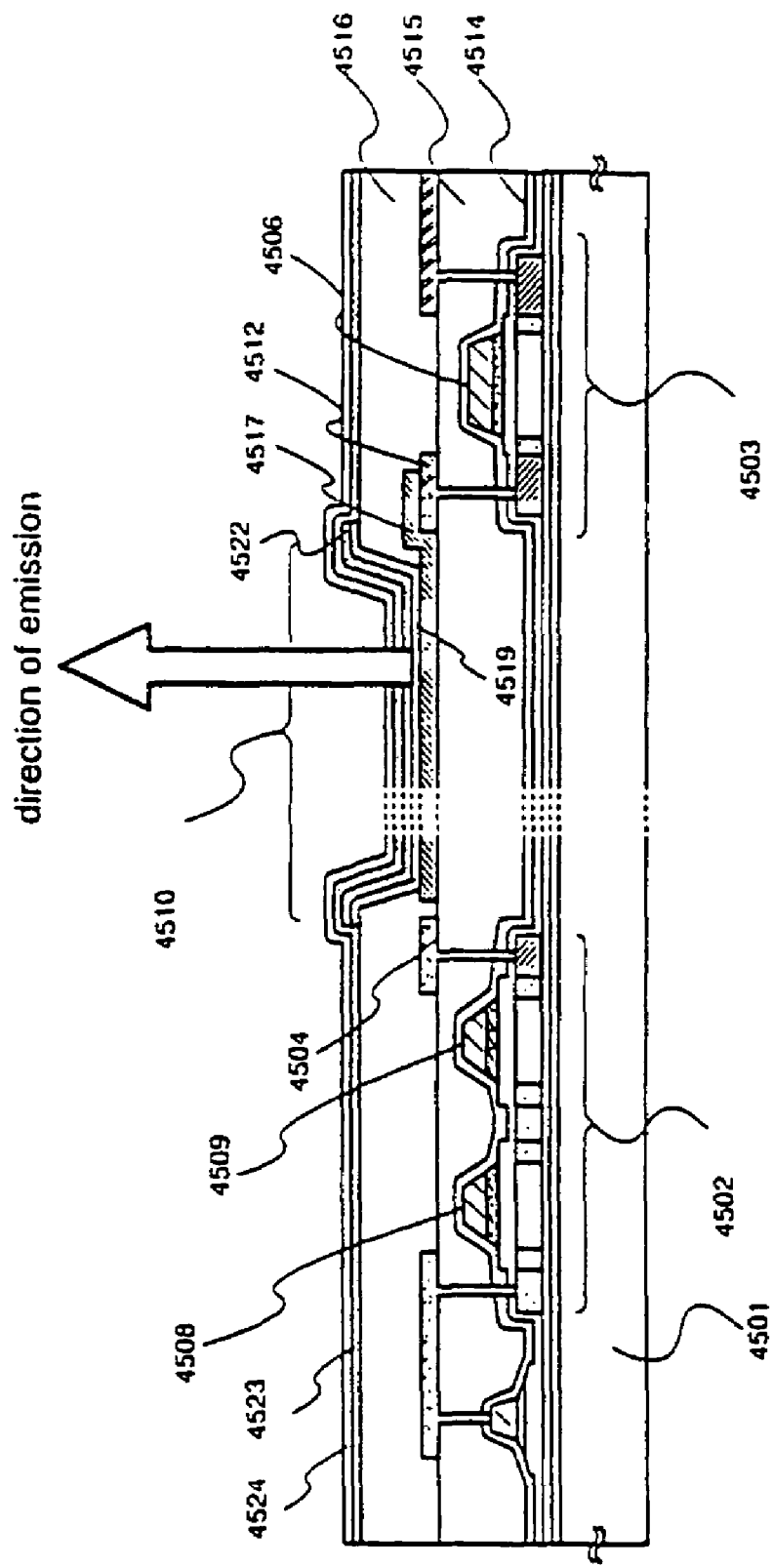
FIG. 13 is a cross-sectional view of a pixel portion of an electro-optical device shown in an embodiment 5.

Here, a more detailed sectional structure of a pixel portion of an electro-optical display device is shown in FIG. 13.

In FIG. 13, a switching TFT 4502 provided on a substrate 4501 is formed by using an n-channel TFT formed by a known method. In this embodiment, although a double gate structure is used, since there is no big difference in the structure and fabricating process, explanation is omitted. However, a structure in which two TFTs are substantially connected in series with each other is obtained by adopting the double gate structure, and there is a merit that an off current value can be decreased. Incidentally, although the double gate structure is adopted in this embodiment, a single gate structure may be adopted, or a triple gate structure or a multi-gate structure having more gates may be adopted. Further, it may be formed by using a p-channel TFT formed by a known method.

Further, an EL driving TFT 4503 is formed by using an n-channel TFT formed by a known method. A drain wiring 4504 of the switching TFT 4502 is electrically connected to a gate electrode 4506 of the EL driving TFT 4503 through a wiring 4505.

Since the EL driving TFT 4503 is an element for controlling the amount of current flowing through an EL element 4510, a large current flows and it is an element having high fear of deterioration due to heat or deterioration due to hot carriers. Thus, it is very effective to adopt a structure in which an LDD region is provided at a drain side of the EL driving TFT 4503 so as to overlap with a gate electrode through a gate insulating film.

In this embodiment, although the EL driving TFT 4503 is shown as a single gate structure, a multi-gate structure in which a plurality of TFTs are connected in series with each other may be adopted. Further, such a structure may be adopted that a plurality of TFTs are connected in parallel with each other to substantially divide a channel forming region into plural portions, so that radiation of heat can be made at high efficiency. Such structure is effective as a countermeasure against deterioration due to heat.

Further, the wiring including the gate electrode 4506 of the EL driving TFT 4503 overlaps with a drain wiring 4512 of the EL driving TFT 4503 through an insulating film, and a storage capacitor is formed in the region. The storage capacitor functions to store a voltage applied to the gate electrode 4506 of the EL driving TFT 4503.

A first interlayer insulating film 4514 is provided on the switching TFT 4502 and the EL driving TFT 4503, and a second insulating film made of an organic resin is formed thereon.

Reference numeral 4517 designates a pixel electrode (cathode of the EL element) made of a conductive film having high reflectivity. The pixel electrode is partly formed to overlap with a drain region of the EL driving TFT 4503 and electrically connected to the drain region. As the pixel electrode 4517, it is preferable to use a low resistance conductive film, such as an aluminum alloy film, a copper alloy film or a silver alloy film, or a lamination film of those. Of course, a laminate structure with another conductive film may be adopted.

Then, an organic resin film 4516 is formed on a pixel electrode 4517 and the flattening film 4516 is patterned to form an EL layer 4519. Herein, although not shown in figure, light-emitting layers corresponding to each color of R (red), G (green), and B (blue) may be formed. As an organic material used for the light-emitting layer, a π-conjugate polymer material is used. Typical examples of the polymer material include polyparaphenylene vinylene (PPV), polyvinyl carbazole (PVK), and polyfluorene.

Although various types exist as the PPV typed organic EL material, for example, a material as disclosed in "H. Shenk, H. Becker, O GOLEDsen, E. Kluge, W. Kreuder, and H. Spreitzer, "Polymers for Light Emitting Diodes", Euro Display, Proceedings, 1999, p. 33-37" or Japanese Patent Application Laid-open No. Hei. 10-92576 may be used.

As a specific light emitting layer, it is appropriate that cyanopolyphenylene-vinylene is used for a light emitting layer emitting red light, polyphenylenevinylene is used for a light emitting layer emitting green light, and polyphenylenevinylene or polyalkylphenyene is used for a light emitting layer emitting blue light. It is appropriate that the film thickness is made 30 to 150 nm (preferably 40 to 100 nm).

However, the above examples are an example of the organic material which can be used for the light emitting layer, and it is not necessary to limit the invention to these. The EL layer (layer in which light emission and movement of carriers for that are performed) may be formed by freely combining a light emitting layer, a charge transporting layer and a charge injecting layer.

For example, although this embodiment shows the example in which the polymer material is used for the light emitting layer, a low molecular organic material may be used. It is also possible to use an inorganic material, such as silicon carbide, as the charge transporting layer or the charge injecting layer. As the EL material or inorganic material, a well-known material can be used.

At the point when the anode 4523 was formed, an EL element 4510 is completed. Incidentally, the EL element 4510 here indicates a storage capacitor formed of the pixel electrode (cathode) 4517, the light emitting layer 4519, the hole injecting layer 4522 and the anode 4523.

In this embodiment, a passivation film 4524 is further provided on the anode 4523. As the passivation film 4524, a silicon nitride film or a silicon nitride oxide film is desirable. This object is to insulate the EL element from the outside, and has both meaning of preventing deterioration due to oxidation of the organic EL material and suppressing degassing from organic EL material. By doing this, the reliability of the electro-optical display device is improved.

As described above, the electro-optical device described in the Embodiment 5 includes the pixel portion comprising the pixel having the structure as shown in FIG. 13, and includes the switching TFT having a sufficiently low off current value and the EL driving TFT resistant to hot carrier injection. Thus, it is possible to obtain the electro-optical display which has high reliability and can make excellent image display.

In the case of an EL element having the structure described in Embodiment 5, light generated in the light emitting layer 4519 is radiated to the substrate on which TFTs are formed as indicated by an arrow.

Embodiment 6

Figure 14:
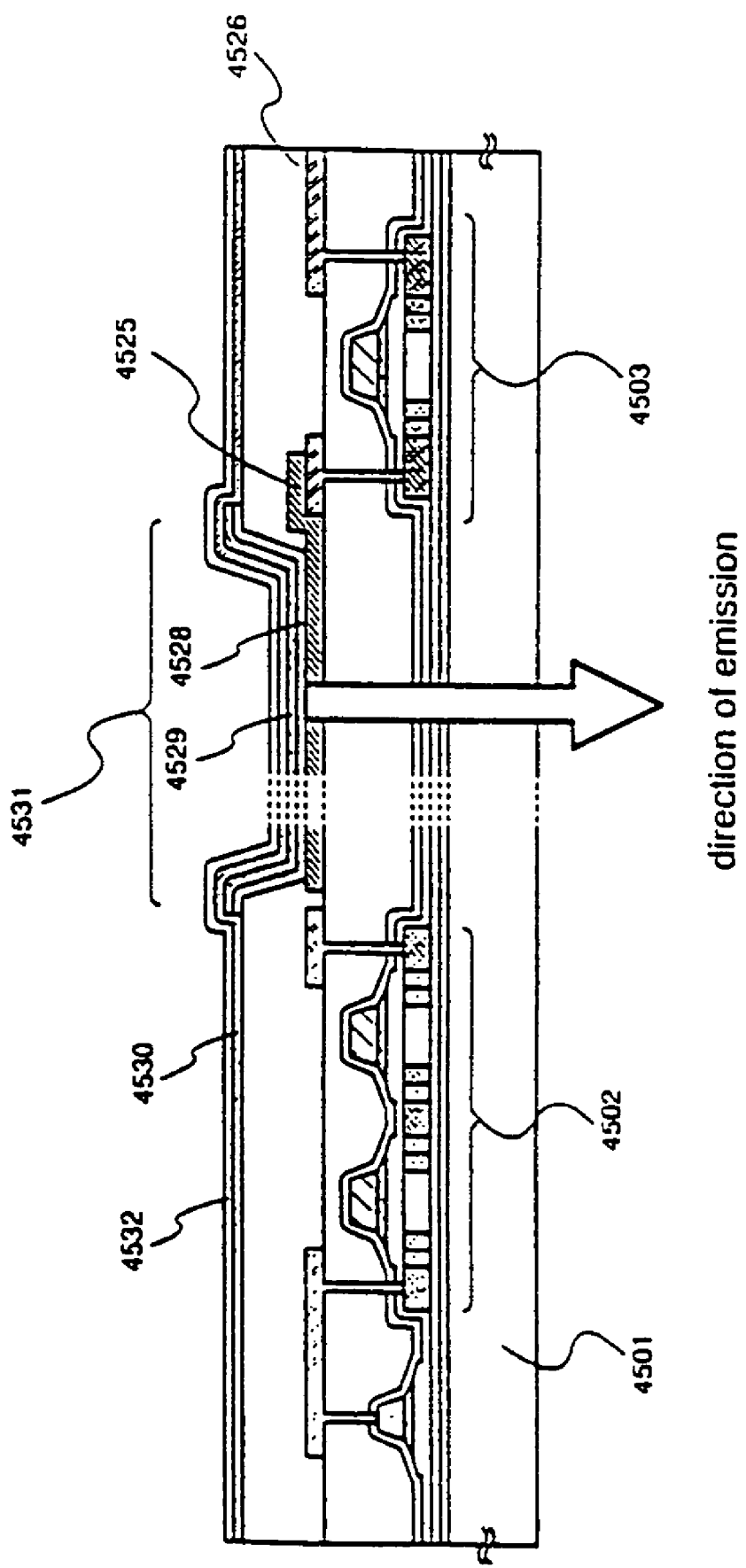
FIG. 14 is a cross-sectional view of a pixel portion of an electro-optical device shown in an embodiment 6.
Figure 15A:
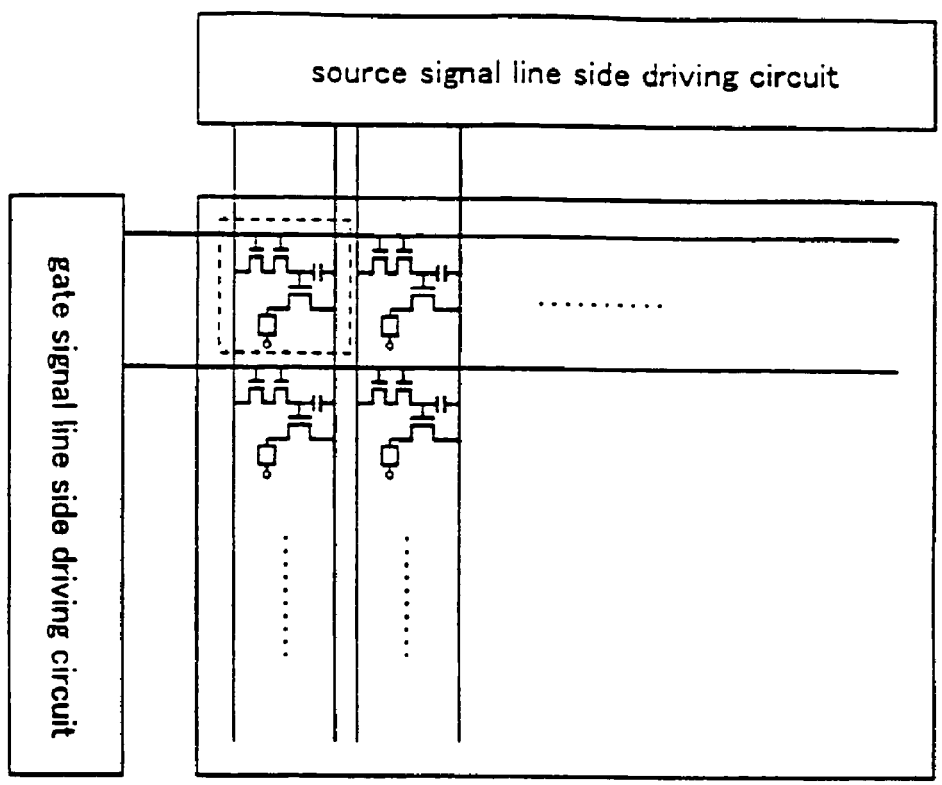
FIGS. 15A and 15B are diagrams showing a circuit constructional example of the electro-optical device.
Figure 15B:
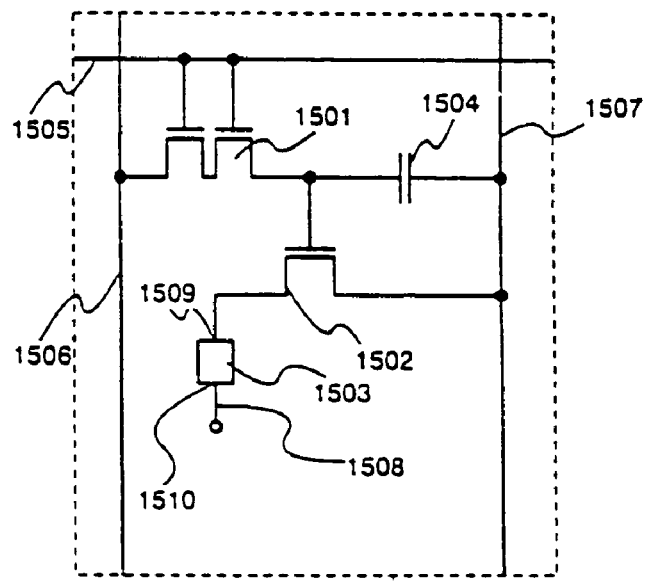

In this embodiment, a description will be made on a structure in which the structure of the EL element 4510 is inverted in the pixel portion shown in Embodiment 5. FIG. 14 is used for the description. Incidentally, points different from the structure of FIG. 13 are only a portion of an EL element and a TFT portion, the other explanation is omitted.

In FIG. 12, a switching TFT 4502 is formed by using a p-channel TFT formed by a known method. An EL driving TFT 4503 is formed by using a p-channel TFT formed by a known method. Herein, it is desirable to use the same polarity for the switching TFT and the EL driving TFT.

In this embodiment, a transparent conductive film is used as a pixel electrode (anode) 4525. Specifically, a conductive film made of a compound of indium oxide and zinc oxide is used. Of course, a conductive film made of a compound of indium oxide and tin oxide may be used.

After a third interlayer insulating film made of an organic film is formed, a light emitting layer 4528 is formed. An electron injecting layer 4529 made of potassium acetylacetonate (expressed as acacK), and a cathode 4530 made of aluminum alloy are formed thereon.

Thereafter, as described in the Embodiment 5, a passivation film 4532 is formed to prevent oxidation of the organic EL material, thereby an EL element 4531 is formed.

In the case of an EL element having the structure described in Embodiment 6, light generated in the light emitting layer 4528 is radiated to the substrate on which TFTs are formed as indicated by an arrow.

Embodiment 7

In this embodiment, a driving method different from that in the Embodiment 1 is combined with the electro-optical device of the present invention. This embodiment is explained with reference to FIGS. 16A to 17B.

Figure 16A:
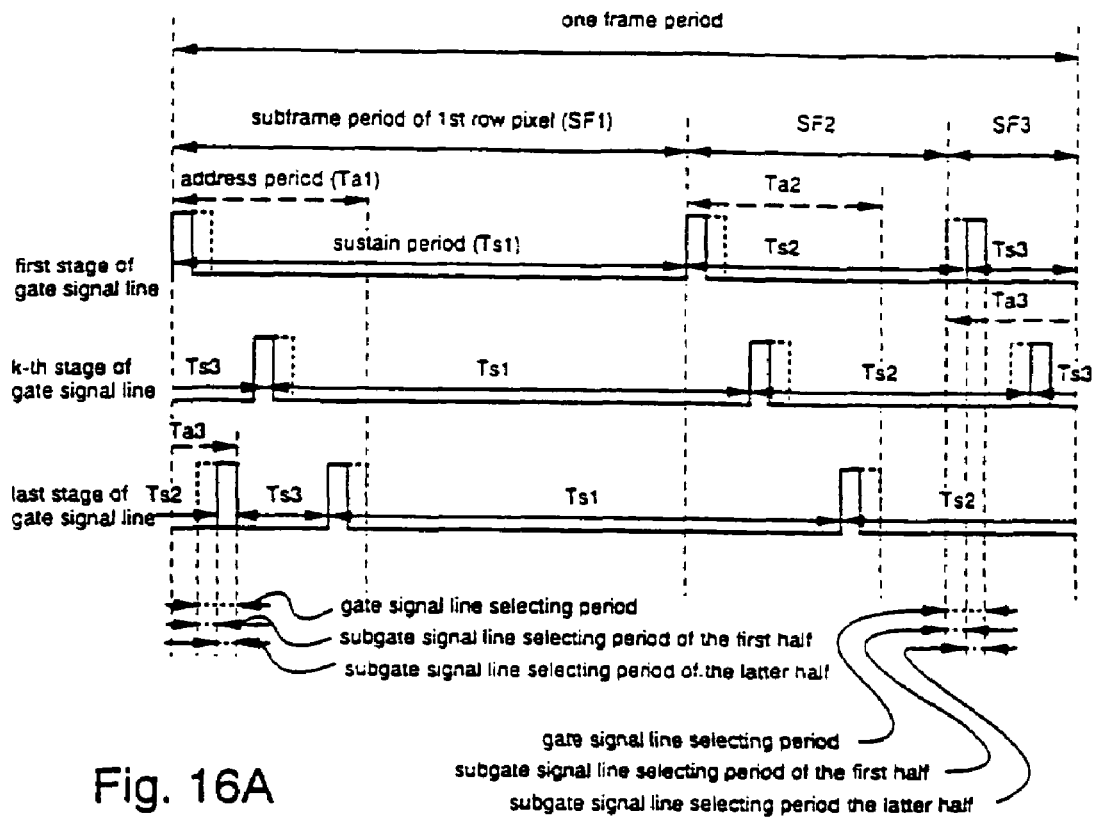
FIGS. 16A and 16B are timing charts for explaining an example of driving an electro-optical device having the pixel of the present invention and shown in an embodiment 7.
Figure 16B:
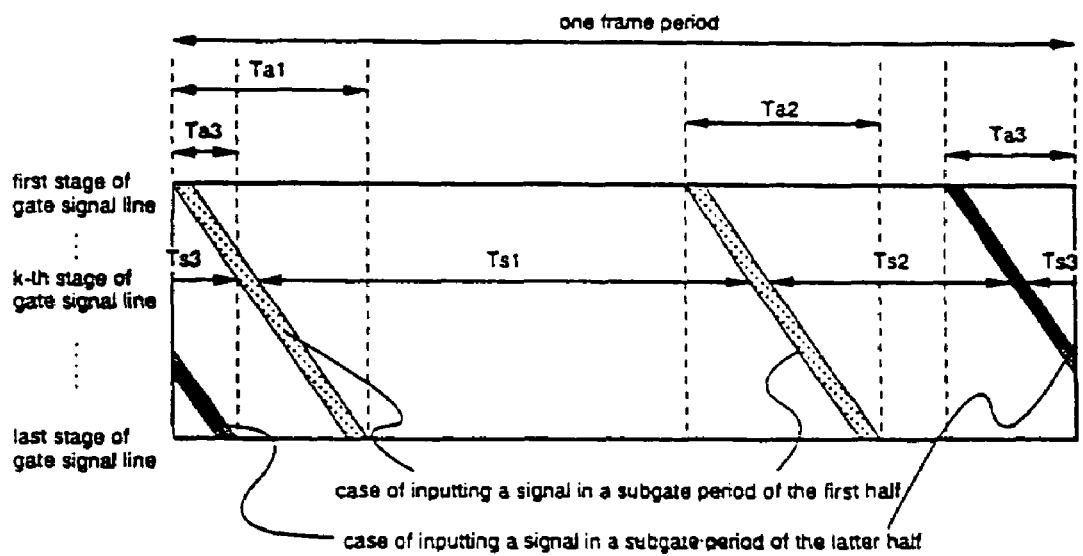

Here, for brevity, gray scale of three bits ($2^3$=8 gray scales) is obtained by combining digital gray scale and time gray scale. FIGS. 16A and 16B show timing charts of this construction. One frame period is divided into three subframe periods $SF_1$ to $SF_3$. Each time interval of the subframe periods $SF_1$ to $SF_3$ is determined by power of 2. Namely, in this case, $SF_1:SF_2:SF_3=4:2:1$ ($2^2:2^1:2^0$) is set.

First, a signal is inputted to pixels stage by stage in a first subframe period. In this case, a gate signal line is actually selected only in a subgate signal line selecting period of the first half. In a subgate signal line selecting period of the latter half, no gate signal line is selected, and no signal is inputted to a pixel. This operation is repeatedly performed from a first stage to a final stage. Here, an address period is a period from the selection of the gate signal line at the first stage to the selection of the gate signal line at the final stage. Accordingly, a time interval of the address period is the same in any subframe period.

Subsequently, a second subframe period is started. A signal is similarly inputted to pixels stage by stage. In this case also, the gate signal line is selected only in the subgate signal line selecting period of the first half. This operation is repeatedly performed from the first stage to the final stage.

At this time, a constant voltage is applied to the cathode wiring of each pixel. Accordingly, a sustain (lighting) period of a pixel in a certain subframe period is defined as a period from the writing of a signal into the pixel in a certain subframe period to start of writing of the signal to a pixel in the next subframe period. Accordingly, the sustain period is different in timing for different stages, but is equal in time interval.

Subsequently, a third subframe period will be explained. First, similar to the first and second subframe periods, the gate signal line is selected in the subgate signal line selecting period of the first half, and a signal is written into a pixel. In this case, when a signal begins to be written into a pixel near the final stage, a writing period of the signal into the pixel at the first stage in the next frame period, i.e., the address period is already started. As a result, writing of the signal into the pixel near the final stage in the third subframe period is overlapped with writing of the signal to a certain pixel in the first half of the first subframe period of the next frame period. It is impossible to write simultaneously different signals of two stages normally into pixels of two different stages. Therefore, in the third subframe period, the gate signal line is selected in the subgate signal line selecting period of the latter half. Accordingly, in the first subframe period (this subframe period belongs to the next frame period), the gate signal line is selected in the subgate signal line selecting period of the first half so that simultaneous writing of signals into different pixels of two stages can be avoided.

As mentioned above, in the driving method of the present invention, when an address period in a certain subframe period is overlapped with an address period in another subframe period, a writing period is allocated by utilizing a plurality of subgate signal line selecting periods. Thus, it is possible to prevent timings of selecting the gate signal lines from being actually overlapped. As a result, a signal can be normally written into a pixel.

Figure 17A:
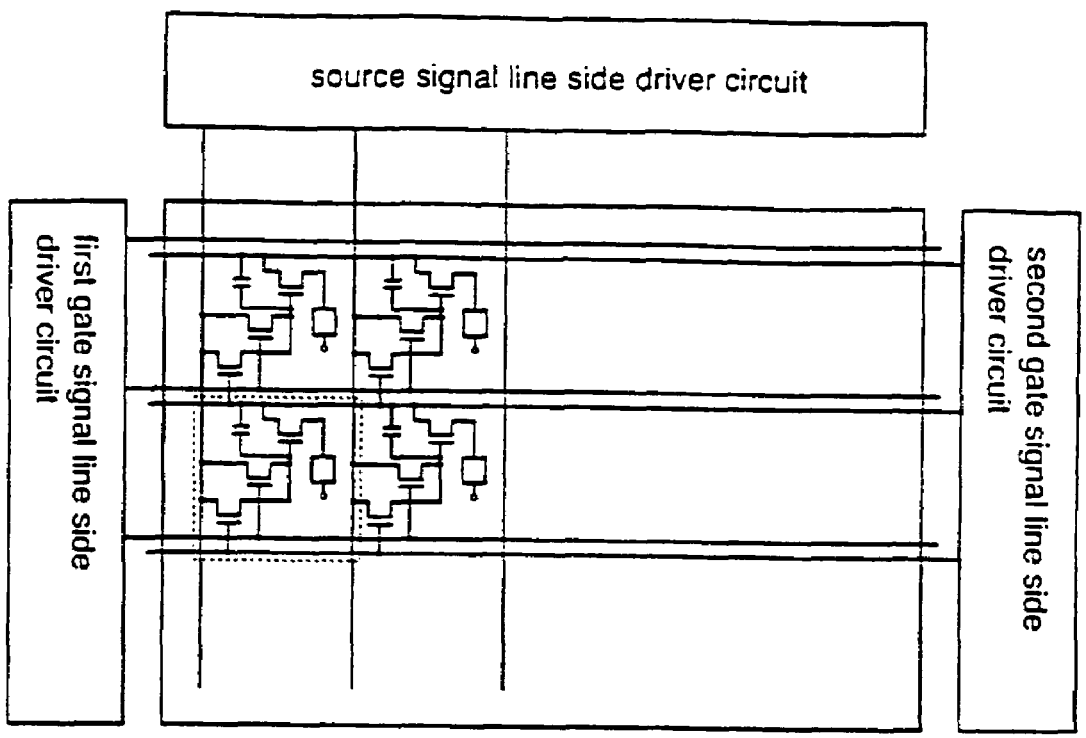
FIGS. 17A and 17B are diagrams showing a circuit constructional example of the electro-optical device having the pixel of the present invention and shown in the embodiment 7.

FIG. 17A shows a circuit constructional example for embodying the driving method of this embodiment. A pixel portion has a structure of the electro-optical device of the present invention.

In FIG. 17A, the pixel portion is arranged in the center of this structure. A source signal line side driving circuit for controlling the operation of a source signal line is arranged above the pixel portion. A pair of gate signal line side driving circuits for controlling the operation of a gate signal line are arranged such that one is on the left and the other is to the right of the pixel portion. A first gate signal line side driving circuit selects the gate signal line in the subgate signal line selecting period of the first half, and a second gate signal line side driving circuit selects the gate signal line in the subgate signal line selecting period of the latter half.

Figure 17B:
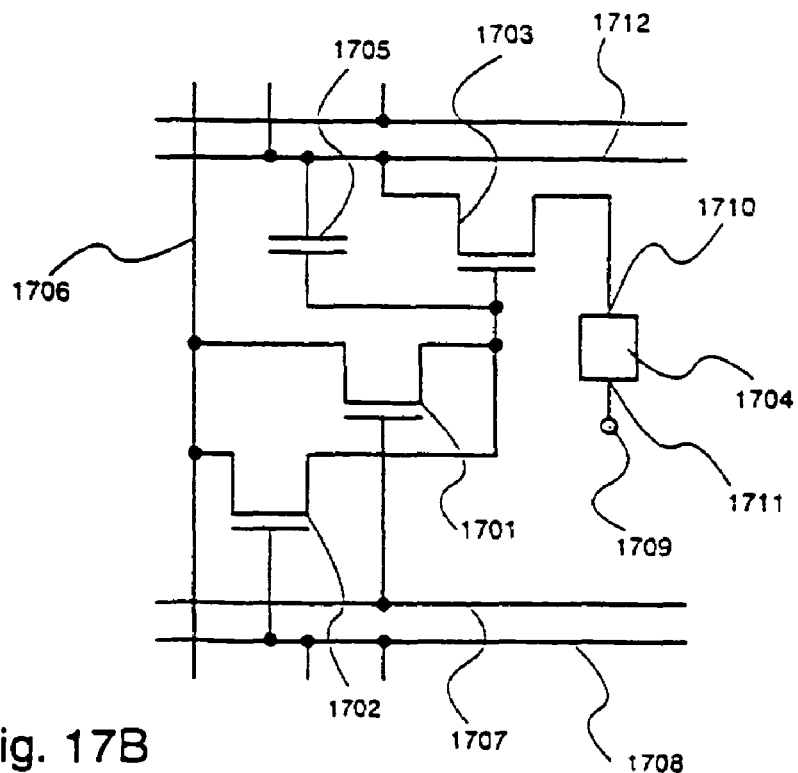

FIG. 17B shows an enlarged view of one pixel portion indicated by a dotted line frame in FIG. 17A. Reference numerals 1701, 1702 and 1703 respectively designate a first switching TFT, a second switching TFT, and an EL driving TFT. Reference numerals 1704, 1705 and 1706 respectively designate an EL element, a holding capacitor and a source signal line. Reference numerals 1707, 1708 and 1709 respectively designate a first gate signal line in an i-th row selected by the first gate signal line side driving circuit, a second gate signal line in the i-th row selected by the second gate signal line side driving circuit, and a cathode electrode. Reference numerals 1710, 1711 and 1712 respectively designate an anode of the EL element, a cathode of the EL element, and a third gate signal line functioning as an electric current supply line to the EL element 1704. As mentioned above, it is not necessary for the third gate signal line 1712 to be a gate signal line in a precedent adjacent row. However, for brevity, given here is an example in which the connection is made to the gate signal line in the precedent adjacent row.

When the gate signal line is selected in the subgate signal line selecting period of the first half, a selecting pulse from the first gate signal line side driving circuit is inputted from the first gate signal line 1707 in the address period, and the first switching TFT 1601 attains a turned-ON state. Thereafter, the EL driving TFT 1703 attains a turned-ON state in the sustain period, and an electric current supplied from the third gate signal line 1712 flows to the EL element 1704. Thus, light is emitted from the EL element 1704 only for a period in which the holding capacitor 1705 holds electric charges applied to the gate electrode of the EL driving TFT 1703.

When the gate signal line is selected in the subgate signal line selecting period of the latter half, a selecting pulse from the second gate signal side driving circuit is inputted from the second gate signal line 1708 in the address period, and the second switching TFT 1602 attains a turned-ON state. Thereafter, the EL driving TFT 1703 attains a turned-ON state in the sustain period, and an electric current supplied from the third gate signal line 1712 flows to the EL element 1704. Thus, light is emitted from the EL element 1704 only for a period in which the holding capacitor 1705 holds electric charges applied to the gate electrode of the EL driving TFT 1703.

Thus, the pixel of the present invention can be used in combination with various driving methods.

Each of TFTs 1701, 1702, 1703 in FIG. 17B is a single gate TFT here. However, in this embodiment, a double gate type and a multi-gate type having more than two gate electrodes may also be used. The polarity of the TFT may be determined in conformity with the structure of the EL element, etc.

Embodiment 8

In this embodiment, a driving method for setting a non-display period brought by the clear period in the embodiment 1 by a method different from that in the embodiment 1 is combined with the electro-optical device of the present invention. This explanation is made with reference to FIGS. 18A to 19B.

Figure 18A:
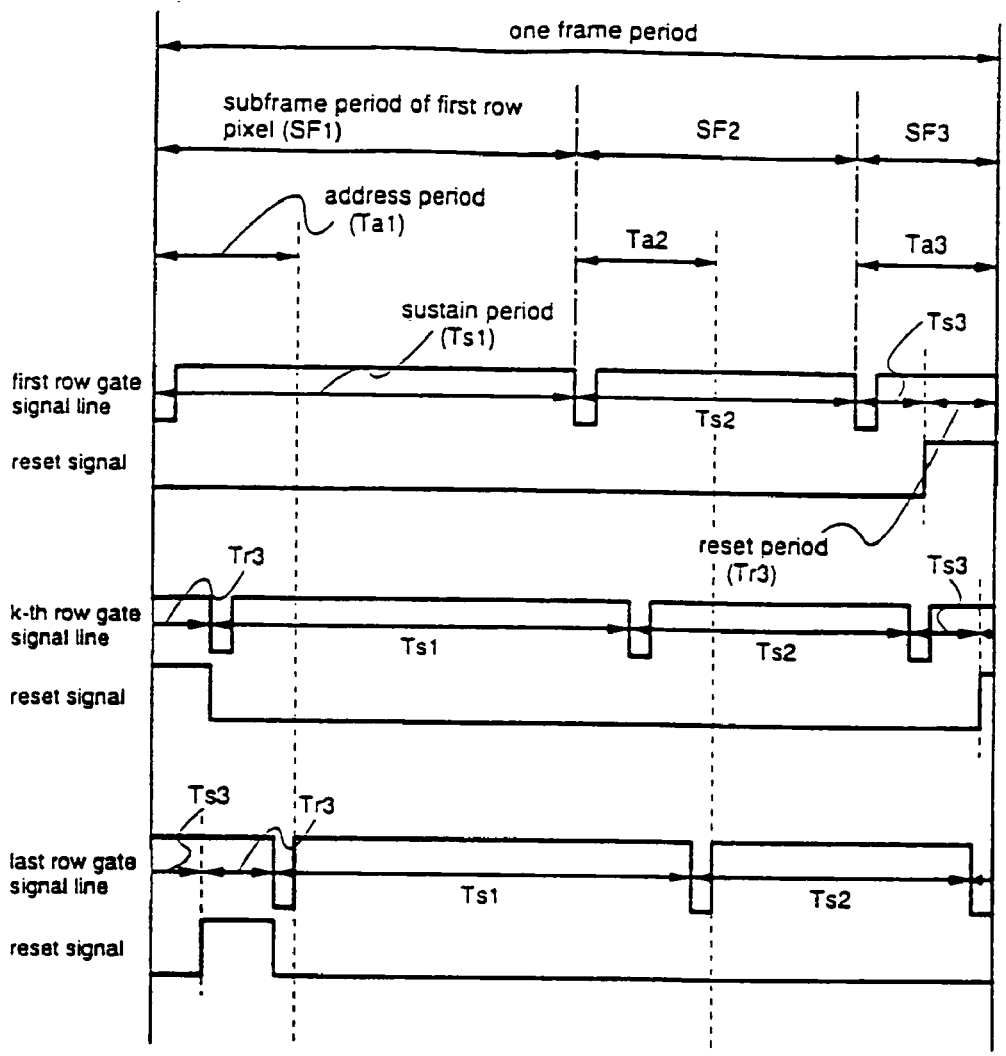
FIGS. 18A and 18B are timing charts for explaining an example of driving an electro-optical device having the pixel of the present invention and shown in an embodiment 8.

FIG. 18A is a timing chart showing an electric potential of the gate signal line when the driving method in this embodiment is executed. Since timing of selecting the gate signal line in each subframe period is similar to that in the embodiment 1, its explanation is omitted here.

In the embodiment 1, the non-display period (clear period) is set by increasing the electric potential of the gate signal line functioning as the electric current supply line to avoid overlapping of the sustain period $Ts_3$ and the address period $Ta_1$ in the next row. In contrast to this, in this embodiment, the non-display period similar to that in the embodiment 1 is set by inputting a reset signal by using a dedicated signal line. Here, this period is called a reset period ($Tr_n$, n: a number designated to the subframe period).

Figure 19A:
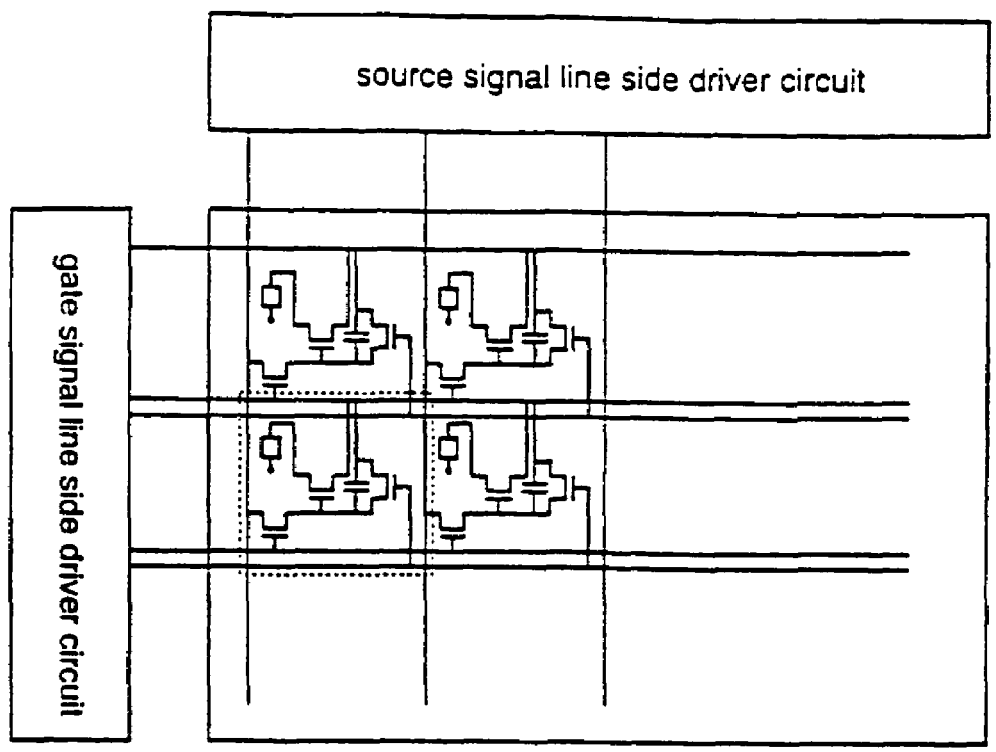
FIGS. 19A and 19B are diagrams showing a circuit constructional example of the electro-optical device having the pixel of the present invention and shown in the embodiment 8.

FIG. 19A shows a circuit constructional example for embodying the driving method of this embodiment. The pixel portion has the structure of the electro-optical device of the present invention.

In FIG. 19A, the pixel portion is arranged in the center of this structure. A source signal line side driving circuit for controlling the operation of a source signal line is arranged above the pixel portion. A gate signal line side driving circuit for controlling the operation of a gate signal line is arranged to the left of the pixel portion. If the gate signal line side driving circuit is arranged on each of the left and the right to a pixel array, although this arrangement is not illustrated, more effective driving can be obtained. The gate signal line side driving circuit in this embodiment has a circuit (not shown) for outputting a reset signal.

Figure 19B:
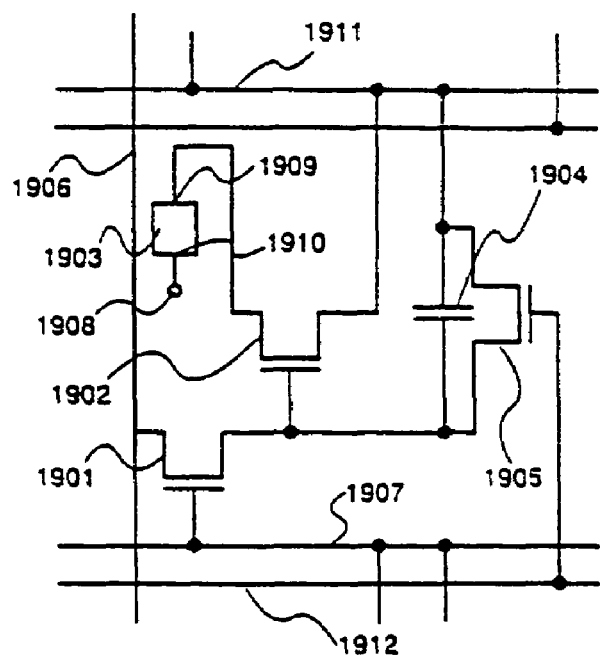

FIG. 19B shows an enlarged view of one pixel portion indicated by a dotted line frame in FIG. 19A. Reference numerals 1901, 1902 and 1903 respectively designate a switching TFT, an EL driving TFT and an EL element. Reference numerals 1904, 1905 and 1906 respectively designate a holding capacitor, a resetting TFT and a source signal line. Reference numerals 1907, 1908 and 1909 respectively designate a first gate signal in an i-th row, a cathode electrode and an anode of the EL element. Reference numerals 1910, 1911 and 1912 respectively designate a cathode of the EL element, a second gate signal line functioning as an electric current supply line for the EL element 1903, and a reset signal line for inputting the reset signal. As mentioned above, it is not necessary for the second gate signal line 1911 to be a gate signal line in a precedent adjacent row. However, for brevity, given as an example is a case in which the connection is made to the gate signal line in the precedent adjacent row.

A selecting pulse from the gate signal line side driving circuit is inputted from the first gate signal line 1907, and the switching TFT 1901 attains a turned-ON state. Thereafter, the EL driving TFT 1902 attains a turned-ON state in the sustain period, and an electric current supplied from the second gate signal line 1911 flows to the EL element 1903. Thus, light is emitted from the EL element 1903 only for a period in which the holding capacitor 1904 holds electric charges applied to the gate electrode of the EL driving TFT 1902.

Figure 18B:
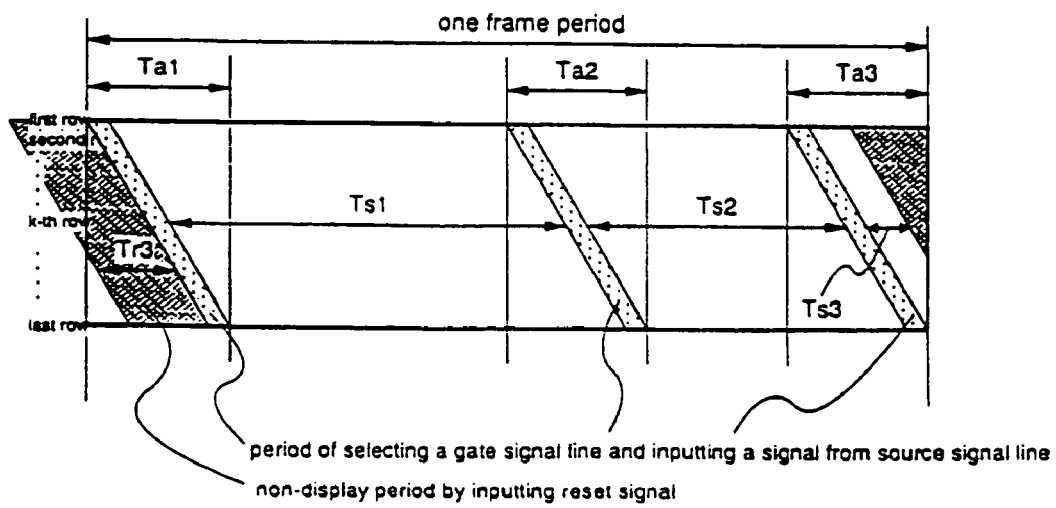

Here, in FIG. 18B, a reset signal is inputted from the reset signal line 1912 in a reset period to avoid overlapping of the sustain period $Ts_3$ and the address period $Ta_1$, and the TFT 1905 for reset attains a turned-ON state and frees the electric charges held in the holding capacitor 1904. Accordingly, the supply of the electric current to the EL element is stopped in this period, and the EL element stops emitting light.

Similar to the embodiment 1, overlapping of the address period and the sustain period is avoided and an image can be normally displayed by setting the non-lighting period in this manner.

The electro-optical device of the present invention can be easily applied also when the circuit as shown in this embodiment is used.

Each of TFTs 1901, 1902 and 1905 in FIG. 19B is a single gate TFT here, but a double gate type and a multi-gate type having more than two gate electrodes may also be used in this embodiment. Polarities of the TFT may be determined in conformity with the structure of the EL element, etc.

Embodiment 9

In this embodiment, a driving method for setting the non-display period brought by using the reset signal in the embodiment 8 by a method different from that in the embodiment 8 is combined with the electro-optical device of the present invention. This explanation is made with reference to FIGS. 20A and 20B.

Figure 20A:
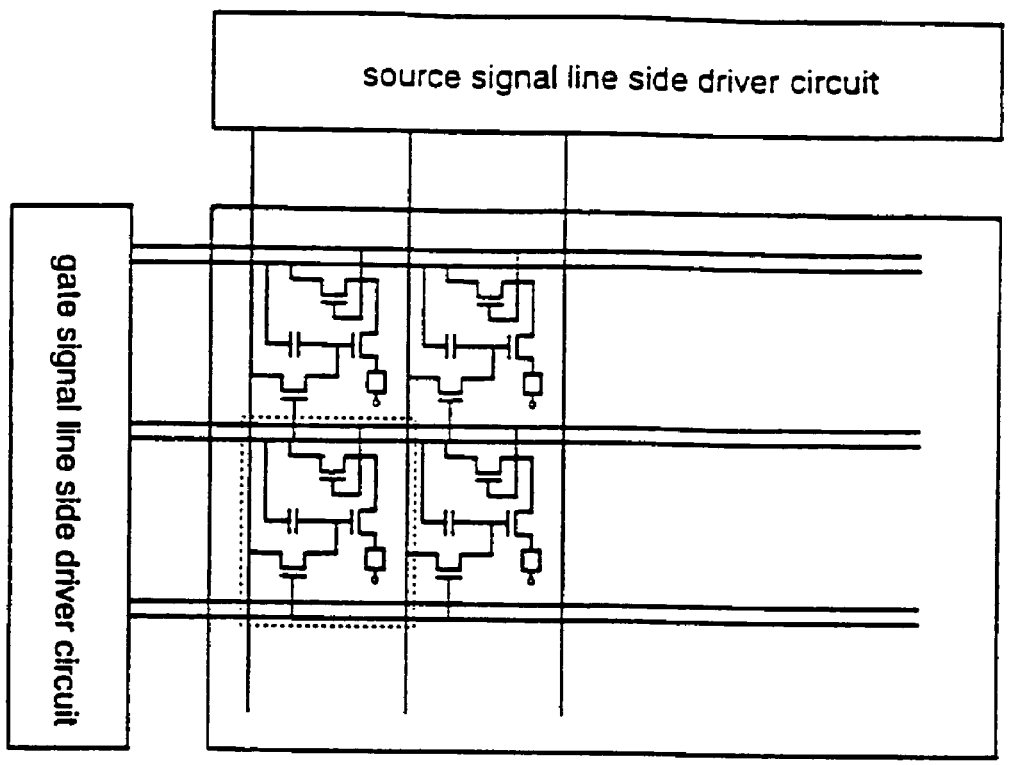
FIGS. 20A and 20B are diagrams showing a circuit constructional example of an electro-optical device having the pixel of the present invention and shown in an embodiment 9.

FIG. 20A shows a circuit constructional example for embodying the driving method of this embodiment. The pixel portion has the structure of the electro-optical device of the present invention.

In FIG. 20A, the pixel portion is arranged in the center of this structure. A source signal line side driving circuit for controlling the operation of a source signal line is arranged above the pixel portion. A gate signal line side driving circuit for controlling the operation of a gate signal line is arranged to the left of the pixel portion. If the gate signal line side driving circuit is arranged on each of the left and the right of a pixel array although this arrangement is not illustrated, more effective driving can be obtained. The gate signal line side driving circuit in this embodiment has a circuit (not shown) for outputting a reset signal.

Figure 20B:
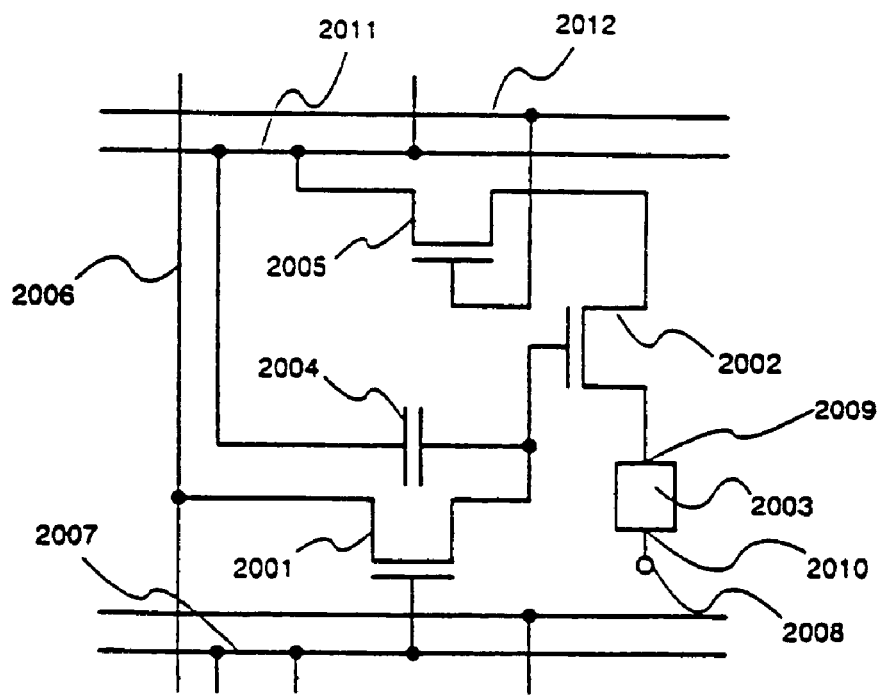

FIG. 20B shows an enlarged view of one pixel portion indicated by a dotted line frame in FIG. 20A. Reference numerals 2001, 2002 and 2003 respectively designate a switching TFT, an EL driving TFT and an EL element. Reference numerals 2004, 2005 and 2006 respectively designate a holding capacitor, a resetting TFT and a source signal line. Reference numerals 2007, 2008 and 2009 respectively designate a first gate signal line in an i-th row, a cathode electrode and an anode of the EL element. Reference numerals 2010, 2011 and 2012 respectively designate a cathode of the EL element, a second gate signal line functioning as an electric current supply line for the EL element 2003, and a reset signal line for inputting the reset signal. As mentioned above, it is not necessary for the second gate signal line 2001 to be a gate signal line in a precedent adjacent row. However, for brevity, given as an example is a case in which the connection is made to the gate signal line in the precedent adjacent row.

Since the driving method of the circuit shown in this embodiment is similar to that in the embodiment 8, it is sufficient to refer to FIGS. 8 A and 8B. Accordingly, the explanation on the method is omitted here. In the embodiment 8, the reset period is obtained by inputting a reset signal to bring the resetting TFT to a turned-ON so that the electric charges in the holding capacitor are freed. In contrast to this, in this embodiment, the TFT 2005 for reset is arranged between the second gate signal line 2011 that is the electric current supply line and the EL driving TFT 2002. In the normal sustain period, the resetting TFT is in a turned-ON state, and an electric current supplied from the second gate signal line 2011 flows to the EL element 2003 through the EL driving TFT 2002. When the reset signal is inputted to the reset signal line 2012 in the reset period, the TFT 2005 for reset attains a turned-OFF state, and the supply of the electric current to the EL element is interrupted. Thus, a non-display period is set.

Similar to the embodiments 1 and 8, overlapping of the address period and the sustain period is avoided and an image can be normally displayed by setting a non-lighting period in this manner.

The electro-optical device of the present invention can be easily applied also when the circuit as shown in this embodiment is used.

Each of TFTs 2001, 2002 and 2005 in FIG. 20B is a single gate TFT here, but a double gate type and a multi-gate type having more than two gate electrodes may also be used in this embodiment. Polarities of the TFT may be determined in conformity with the structure of the EL element, etc.

Embodiment 10

In this embodiment, a driving method different from those in the embodiments 1 and 7 to 9 is combined with a pixel of the present invention. A circuit construction is similar to that in the embodiment 1. The following explanation is made with reference to FIGS. 5A and 5B and FIGS. 21A and 21B.

Figure 21A:
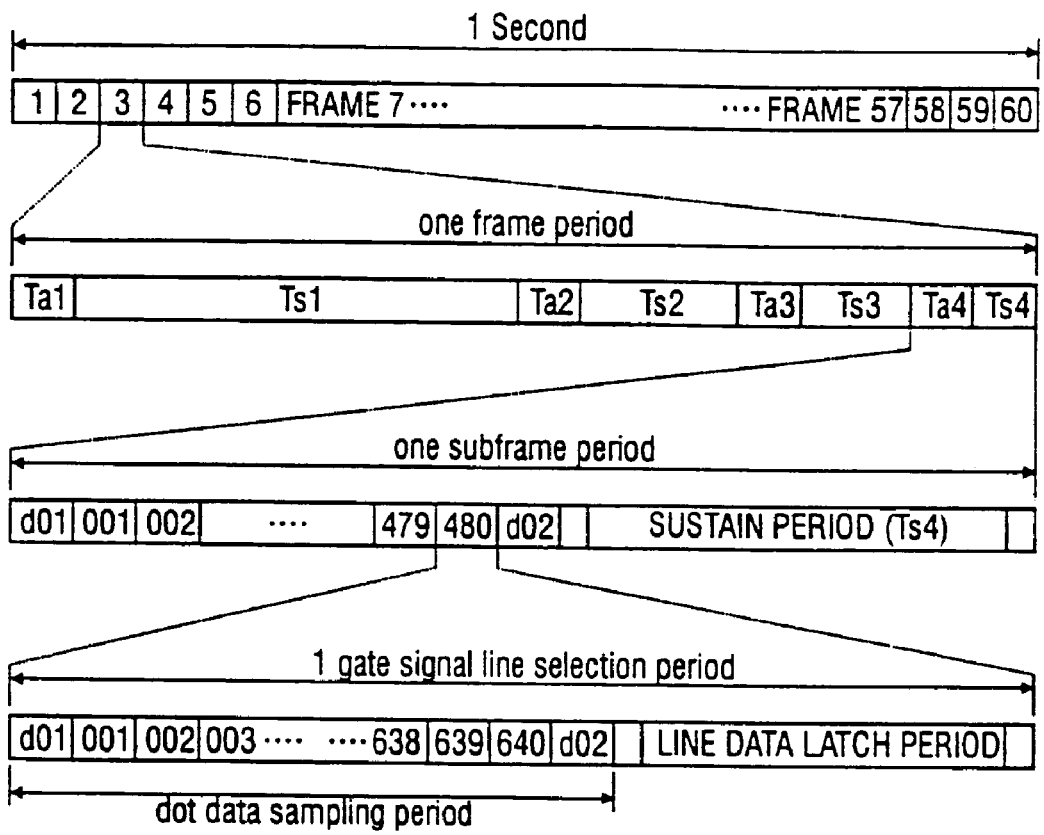
FIGS. 21A and 21B are timing charts for explaining an example of driving an electro-optical device having the pixel of the present invention and shown in an embodiment 10.

FIG. 21A is a timing chart showing driving using a time divisional gray scale method for obtaining gray scale by utilizing a difference in lighting time. In this figure, a case in which frame frequency is set to 60 [Hz], and VGA and four-bit gray scale is illustrated.

One frame period is divided into four subframe periods. Each subframe period is completely separated into the address period and the sustain period. In the sustain periods $Ts_1$ to $Ts_4$, $Ts_1:Ts_2:Ts_3:Ts_4=2^3:2^2:2^1:2^0=8:4:2:1$ is set so that 4 bits=16 gray scales can be displayed. Since each of the address periods $Ta_1$ to $Ta_4$ is a period for writing into pixels of one screen, all these address periods are equal to each other in time interval.

Writing of data performed in one subframe period will be explained. First, digital data inputted through the source signal line are sequentially sampled. After sampling for one horizontal period (since VGA is adopted in the case of this embodiment, it corresponds to 640 lines+two dummy lines) is terminated, data are simultaneously latched. This operation is repeated for all the gate signal lines (since VGA is adopted in the case of this embodiment, it corresponds to 480 lines+two dummy lines in total). Thus writing of one frame is completed in each bit.

Figure 21B:
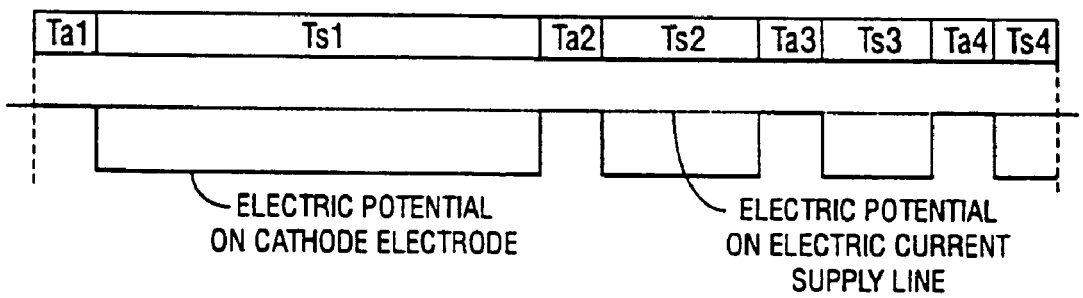

While this writing is performed, as shown in FIG. 21B, the electric potential of the cathode 108 is set in advance to be equal to the electric potential of the electric current supply line (the gate signal line 111 functioning as the electric current supply line when combined with the pixel of the present invention). Thus, in this period, no voltage is generated between the anode 109 and the cathode 110 of the EL element 103, and no electric current flows. Namely, no light is emitted from any EL element 103 in the screen during the address period.

During the address period, after the writing of one frame for every bit is completed, the electric potential of the cathode 108 having had the same electric potential as the electric current supply line till then is reduced, and a voltage is generated between the anode and the cathode of the EL element to be lighted. Thus, an electric current flows through the EL element 103 and light is emitted from the EL element 103. The light emission of the EL element 103 lasts for a certain period after the switching TFT 101 is turned off, because the voltage application to the gate of the EL driving TFT 102 is held by the holding capacitor 104. Accordingly, the light emission is continued for a constant period.

The driving method shown in this embodiment can be easily carried out, and can be easily applied also when the driving method is combined with the electro-optical device of the present invention.

The switching TFT 101 in FIG. 5B is a double gate TFT here, and the EL driving TFT 102 is a single gate TFT here.

However, in this embodiment, a multi-gate type having three or more gate electrodes may also be used instead of the single gate type and the double gate type. The polarity of the TFT may be determined in conformity with the structure of the EL element, etc.

Embodiment 11

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an EL material (coumarin pigment) reported by the above article is represented as follows.

(Compound 1)
(M. A. Baldo, D. F. O'Brien, Y. You, A. Shoustikov, S. Sibley, M. E. Thompson, S. R. Forrest, Nature 395 (1998) p. 151)

The molecular formula of an EL material (Pt complex) reported by the above article is represented as follows.

(Compound 2)
(M. A. Baldo, S. Lamansky, P. E. Burrows, M. E. Thompson, S. R. Forrest, Appl. Phys. Lett., 75 (1999) p. 4.) (T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502)

The molecular formula of an EL material (Ir complex) reported by the above article is represented as follows.

(Compound 3)
As described above, if phosphorescence from a triplet exciton can be put to practical use, it can realize the external light emitting quantum efficiency three to four times as high as that in the case of using fluorescence from a singlet exciton in principle. The structure according to this embodiment can be freely implemented in combination of any structures of the first to tenth embodiments.

Embodiment 12

An EL display using the electro-optical device in accordance with the present invention has superior visibility in bright locations in comparison to a liquid crystal display device because it is of a self-luminous type, and moreover viewing angle is wide. Accordingly, it can be used as a display portion for various electronic instruments. For example, it is appropriate to use the electro-optical display of the present invention as a display portion of an EL display having a diagonal equal to 30 inches or greater (typically equal to 40 inches or greater) for appreciation of TV broadcasts by a large screen.

Note that all displays exhibiting (displaying) information such as a personal computer display, a TV broadcast reception display, or an advertisement display are included as the. EL display device. Further, the EL display of the present invention can be used as a display portion of the other various electronic instruments.

The following can be given as examples of such electronic instruments: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital video disk (DVD)). In particular, because portable information terminals are often viewed from a diagonal direction, the wideness of the field of vision is regarded as very important. Thus, it is preferable that the EL display is employed. Examples of these electronic instruments are shown in FIGS. 22 and 23.

Figure 22A:
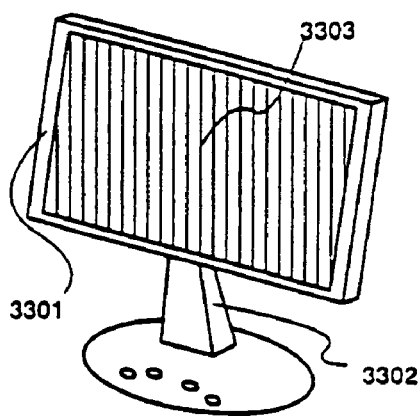
FIGS. 22A to 22F are diagrams showing examples of an electronic device into which an electro-optical device of the present invention is assembled.

FIG. 22A illustrates an EL display which includes a frame 3301, a support table 3302, a display portion 3303, or the like. The electro-optical display of the present invention can be used as the display portion 3303. The EL display device is of a self-luminous type and therefore requires no backlight. Thus, the display portion thereof can have a thickness thinner than that of the liquid crystal display device.

Figure 22B:
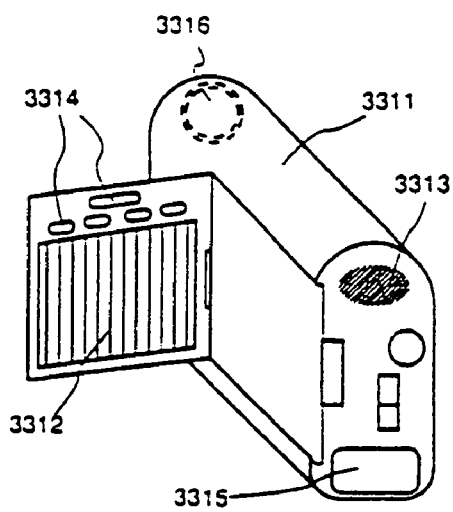

FIG. 22B illustrates a video camera which includes a main body 3311, a display portion 3312, an audio input portion 3313, operation switches 3314, a battery 3315, an image receiving portion 3316, or the like. The electro-optical display device in accordance with the present invention can be used as the display portion 3312.

Figure 22C:
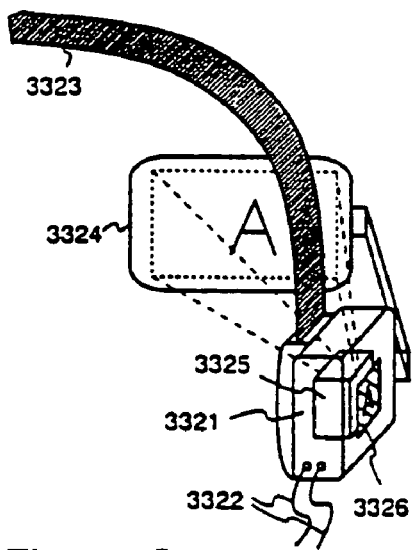

FIG. 22C illustrates a portion (the right-half piece) of a head-mounted type EL display which includes a main body 3321, signal cables 3322, a head mount band 3323, a display portion 3324, an optical system 3325, a display device 3326, or the like. The electro-optical display device in accordance with the present invention can be used as the display device 3326.

Figure 22D:
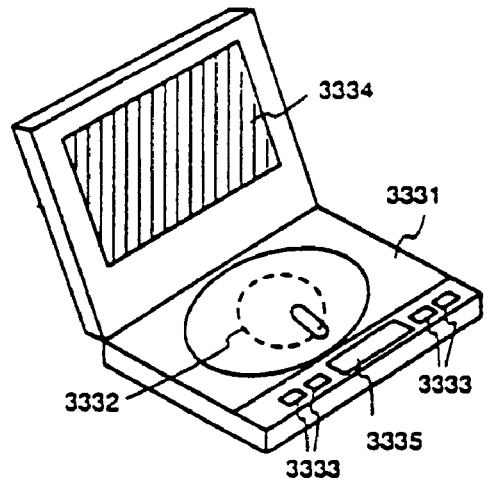

FIG. 22D illustrates an image reproduction apparatus which includes a recording medium (more specifically, a DVD reproduction apparatus), which includes a main body 3331, a recording medium (a DVD or the like) 3332, operation switches 3333, a display portion (a) 3334, another display portion (b) 3335, or the like. The display portion (a) 3334 is used mainly for displaying image information, while the display portion (b) 3335 is used mainly for displaying character information. The electro-optical device in accordance with the present invention can be used as these display portions (a) 3334 and (b) 3335. The image reproduction apparatus including a recording medium further includes a domestic game equipment or the like.

Figure 22E:
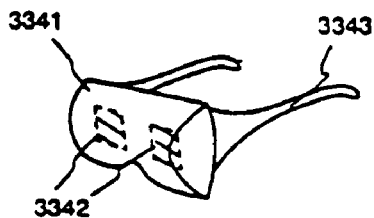

FIG. 22E illustrates a goggle type display (head-mounted display) which includes a main body 3341, a display portion 3342, an arm portion 3343. The electro-optical device in accordance with the present invention can be used as the display portion 3342.

Figure 22F:
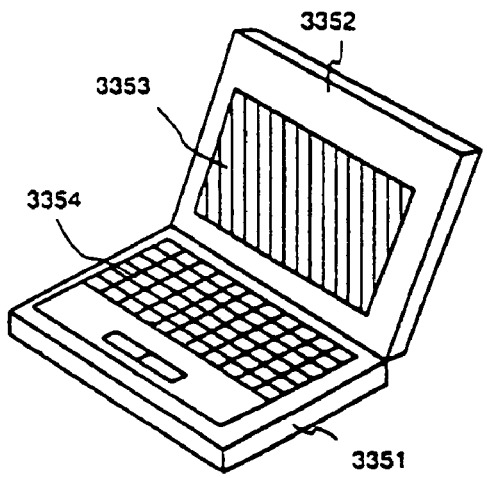

FIG. 22F illustrates a personal computer which includes a main body 3351, a frame 3352, a display portion 3353, a keyboard 3354, or the like. The electro-optical device in accordance with the present invention can be used as the display portion 3353.

Note that if emission luminance of an EL material becomes higher in the future, it will be applicable to a front-type or rear-type projector in which light including output image information is enlarged by means of lenses or the like to be projected.

The above mentioned electronic instruments are more likely to be used for display information distributed through a telecommunication path such as Internet, a CATV (cable television system), and in particular likely to display moving picture information. The EL display is suitable for displaying moving pictures since the EL material can exhibit high response speed.

Further, since a light emitting portion of the EL display consumes power, it is desirable to display information in such a manner that the light emitting portion therein becomes as small as possible. Accordingly, when the EL display is applied to a display portion which mainly displays character information, e.g., a display portion of a portable information terminal, and more particular, a portable telephone or an audio reproducing device, it is desirable to drive the EL display so that the character information is formed by a light-emitting portion while a non-emission portion corresponds to the background.

Figure 23A:
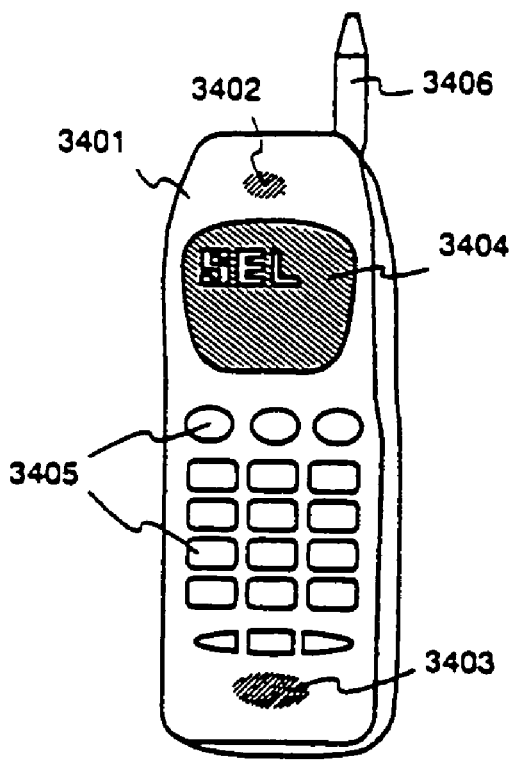
FIGS. 23A and 23B are diagrams showing examples of an electronic device into which an electro-optical device of the present invention is assembled.

FIG. 23A illustrates a portable telephone which includes a main body 3401, an audio output portion 3402, an audio input portion 3403, a display portion 3404, operation switches 3405, and an antenna 3406. The electro-optical display in accordance with the present invention can be used as the display portion 3404. Note that the display portion 3404 can reduce power consumption of the portable telephone by displaying white-colored characters on a black-colored background.

Figure 23B:
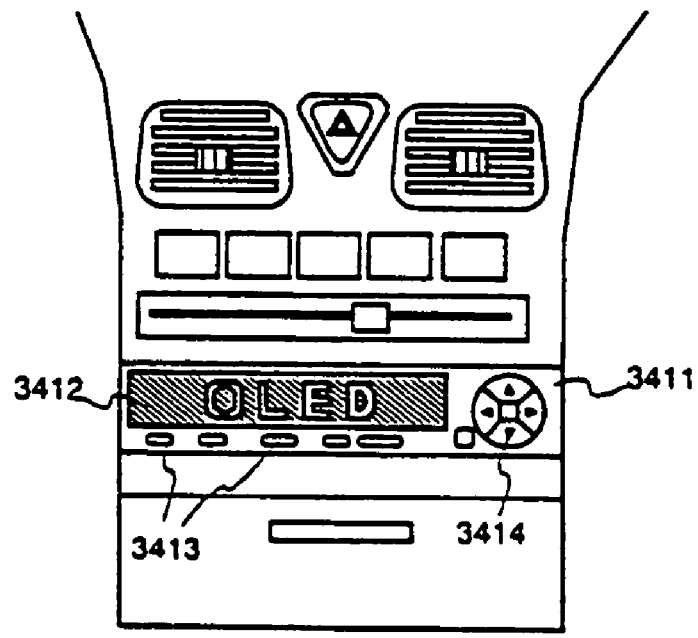

Further, FIG. 23B illustrates a sound reproduction device, specifically, a car audio equipment, which includes a main body 3411, a display portion 3412, and operation switches 3413 and 3414. The electro-optical display in accordance with the present invention can be used as the display portion 3412. Although the car audio equipment of the mount type is shown in the present embodiment, the present invention is also applicable to a portable type or domestic sound reproducing device. The display portion 3414 can reduce power consumption by displaying white-colored characters on a black-colored background, which is particularly advantageous for the portable type sound reproduction device.

As set forth above, the present invention can be applied variously to a wide range of electronic instruments in all fields. The electronic instruments in the present embodiment may use an electro-optical device having any one of configurations shown in Embodiments 1 to 11.

The need for a power supply line is eliminated by using the electro-optical device of the present invention. Therefore, higher aperture ratio can be realized without increasing a mask sheet number and a step number in a panel making process in comparison with the conventional electro-optical device. In the case where the aperture ratio is not higher than but equal to the conventional one, a signal line can be thickened accordingly. Therefore, resistivity is reduced, crosstalk and luminance inclination, etc. can be reduced, and image quality can be improved.

Compound 1

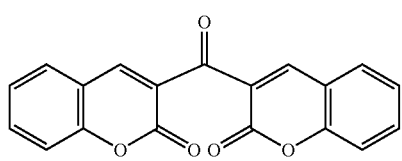

-continued

Compound 2

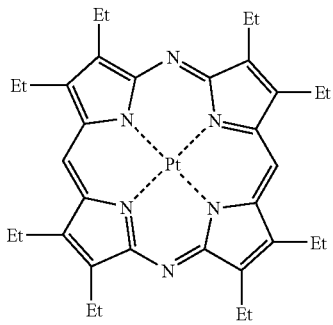

Compound 3

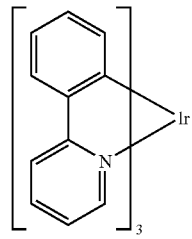

What is claimed:

1. A light emitting device comprising:
a pixel comprising a first transistor, a second transistor and a light emitting element;
a first wiring electrically connected to a gate electrode of the first transistor;
a second wiring electrically connected to one of impurity regions of the first transistor; and
a third wiring electrically connected to one of impurity regions of the second transistor,
wherein another one of impurity regions of the second transistor is electrically connected to the light emitting element,
wherein the first transistor and the second transistor have a same conductivity type,
wherein the first wiring is parallel to the third wiring,
wherein a length of a period in which the light emitting element is in a non light-emitting state is controlled by controlling an electric potential of the third wiring, and
wherein each of the first transistor and the second transistor comprises a crystalline semiconductor film.

2. A light emitting device comprising:
a pixel formed over a substrate, and comprising a first transistor, a second transistor and a light emitting element;
a first wiring electrically connected to a gate electrode of the first transistor;
a second wiring electrically connected to one of impurity regions of the first transistor;
a third wiring electrically connected to one of impurity regions of the second transistor; and
a driving circuit formed over the substrate, electrically connected to the third wiring, and supplying a signal to the third wiring,
wherein another one of impurity regions of the second transistor is electrically connected to the light emitting element,
wherein the first transistor and the second transistor have a same conductivity type, wherein the first wiring is parallel to the third wiring, and
wherein a length of a period in which the light emitting element is in a non light-emitting state is controlled by controlling an electric potential of the signal.

3. A light emitting device comprising:
a first pixel corresponding to red, a second pixel corresponding to green, and a third pixel corresponding to blue, each of the first, second and third pixels comprising a first transistor, a second transistor and a light emitting element electrically connected to one of impurity regions of the second transistor;
a first wiring electrically connected to a gate electrode of the first transistor in each of the first, second and third pixels; and
a third wiring electrically connected to another one of impurity regions of the second transistor in each of the first, second and third pixels,
wherein the first and second transistors have a same conductivity type,
wherein the first wiring is parallel to the third wiring,
wherein a length of a period in which the light emitting element is in a non light-emitting state is controlled by controlling an electric potential of the third wiring, and
wherein each of the first transistor and the second transistor comprises a crystalline semiconductor film.

4. A light emitting device according to claim 1, wherein the electric potential of the third wiring in the non light-emitting state is lower than an electric potential of the third wiring in a light-emitting state.

5. A light emitting device according to claim 2, wherein the electric potential of the signal in the non light-emitting state is lower than an electric potential of the signal in a light-emitting state.

6. A light emitting device according to claim 3, wherein the electric potential of the signal in the non light-emitting state is lower than an electric potential of the signal in a light-emitting state.

7. A light emitting device according to claim 1, further comprising a fourth wiring electrically connected to one of impurity regions of the first transistor through a first contact hole, wherein the first wiring is electrically connected to the gate electrode of the first transistor through a second contact hole, and wherein the first and second wirings comprises a same material.

8. A light emitting device according to claim 2, further comprising a fourth wiring electrically connected to one of impurity regions of the first transistor through a first contact hole, wherein the first wiring is electrically connected to the gate electrode of the first transistor through a second contact hole, and wherein the first and second wirings comprises a same material.

9. A light emitting device according to claim 3, further comprising a fourth wiring electrically connected to one of impurity regions of the first transistor through a first contact hole, wherein the first wiring is electrically connected to the gate electrode of the first transistor through a second contact hole, and wherein the first and second wirings comprises a same material.

10. A light emitting device according to claim 1, wherein the light emitting element emits light by a triplet exciton.

11. A light emitting device according to claim 2, wherein the light emitting element emits light by a triplet exciton.

12. A light emitting device according to claim 3, wherein the light emitting element emits light by a triplet exciton.

13. A light emitting device according to claim 1, wherein a direction of light emission from the light emitting element is opposed to a direction from the light emitting element to a substrate where the pixel is formed.

14. A light emitting device according to claim 2, wherein a direction of light emission from the light emitting element is opposed to a direction from the light emitting element to the substrate where the pixel is formed.

15. A light emitting device according to claim 3, wherein a direction of light emission from the light emitting element is opposed to a direction from the light emitting element to a substrate where the pixel is formed.

16. A light emitting device according to claim 1, wherein an analog video signal is input to a gate electrode of the second transistor through the second wiring and the first transistor.

17. A light emitting device according to claim 2, wherein an analog video signal is input to a gate electrode of the second transistor through the second wiring and the first transistor.

18. A light emitting device according to claim 3, wherein an analog video signal is input to a gate electrode of the second transistor through the second wiring and the first transistor.

19. A semiconductor device comprising:
a pixel comprising a first transistor and a second transistor;
a first wiring electrically connected to a gate electrode of the first transistor;
a second wiring electrically connected to one of impurity regions of the first transistor;
a third wiring electrically connected to one of impurity regions of the second transistor; and
a fourth wiring electrically connected to one of impurity regions of the first transistor through a first contact hole,
wherein the first transistor and the second transistor have a same conductivity type,
wherein the first wiring is parallel to the third wiring,
wherein the first wiring is electrically connected to the gate electrode of the first transistor though a second contact hole,
wherein the first and second wirings comprise a same material, and
wherein each of the first transistor and the second transistor comprises a crystalline semiconductor film.

20. A semiconductor device comprising:
a pixel formed over a substrate, and comprising a first transistor and a second transistor;
a first wiring electrically connected to a gate electrode of the first transistor;
a second wiring electrically connected to one of impurity regions of the first transistor;
a third wiring electrically connected to one of impurity regions of the second transistor;
a fourth wiring electrically connected to one of impurity regions of the first transistor through a first contact hole; and
a driving circuit formed over the substrate, electrically connected to the third wiring, and supplying a signal to the third wiring,
wherein the first transistor and the second transistor have a same conductivity type,
wherein the first wiring is parallel to the third wiring,
wherein the first wiring is electrically connected to the gate electrode of the first transistor through a second contact hole, and
wherein the first and second wirings comprise a same material.

* * * * *